(12) United States Patent
Ishida

(10) Patent No.: US 8,743,045 B2
(45) Date of Patent: Jun. 3, 2014

(54) LEVEL SHIFTER CIRCUIT, SCANNING LINE DRIVER AND DISPLAY DEVICE

(75) Inventor: Tatsuya Ishida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 228 days.

(21) Appl. No.: 13/322,507

(22) PCT Filed: May 28, 2010

(86) PCT No.: PCT/JP2010/059148
§ 371 (c)(1),
(2), (4) Date: Nov. 25, 2011

(87) PCT Pub. No.: WO2010/140556
PCT Pub. Date: Dec. 9, 2010

(65) Prior Publication Data
US 2012/0075279 A1    Mar. 29, 2012

(30) Foreign Application Priority Data
Jun. 1, 2009 (JP) ................. 2009-132253

(51) Int. Cl.
*G09G 3/36*    (2006.01)
(52) U.S. Cl.
USPC ........................................................ 345/100
(58) Field of Classification Search
USPC ................... 345/87–104, 211–213
See application file for complete search history.

(56) References Cited

U.S. PATENT DOCUMENTS

| | | | | |
|---|---|---|---|---|
| 6,002,290 A | * | 12/1999 | Avery et al. | 327/333 |
| 6,566,930 B1 | * | 5/2003 | Sato | 327/333 |
| 2002/0113769 A1 | * | 8/2002 | Tsuchiya | 345/100 |
| 2002/0118159 A1 | * | 8/2002 | Azami | 345/98 |
| 2003/0063061 A1 | * | 4/2003 | Frazee et al. | 345/100 |
| 2004/0212578 A1 | * | 10/2004 | Itou et al. | 345/100 |
| 2005/0057556 A1 | * | 3/2005 | Kubota et al. | 345/211 |

(Continued)

FOREIGN PATENT DOCUMENTS

| | | |
|---|---|---|
| JP | 5-313129 A | 11/1993 |
| JP | 6-318055 A | 11/1994 |

(Continued)

OTHER PUBLICATIONS

PCT/ISA/210—International Search Report dated Jul. 6, 2010 for PCT/JP2010/059148.

*Primary Examiner* — Chanh Nguyen
*Assistant Examiner* — Sanghyuk Park
(74) *Attorney, Agent, or Firm* — Birch, Stewart, Kolasch & Birch, LLP

(57) ABSTRACT

An object of the present invention is to achieve a scanning line drive device which allows further reduction of circuit scale and production costs. A gate driver (100) of the present invention includes: a shift register circuit (1) including g latch circuits (21) to (2g); g selection circuits (8); and g level shifter circuits (3). A level shifter circuit (3) of an output drive circuit (st1) receives a pulse (61) from a NAND circuit (6) of a selection circuit (8) at its input terminal (N1); a pulse (71) from a NAND circuit (7) of the selection circuit (8) at its input terminal (N2); and a pulse (Q1) from a latch circuit (21) at its input terminal (N3). The level shifter circuit (3) of the output drive circuit (st1) outputs a voltage signal obtained by converting the voltage level of the pulse (61) from its output terminal (O1); and a voltage signal obtained by converting the voltage level of the pulse (71) from its output terminal (O2).

10 Claims, 24 Drawing Sheets

(56) References Cited

U.S. PATENT DOCUMENTS

| | | |
|---|---|---|
| 2005/0134352 A1* | 6/2005 | Yokoyama et al. ............ 327/291 |
| 2006/0214686 A1* | 9/2006 | Nakao ............................. 326/81 |
| 2006/0221043 A1* | 10/2006 | Horibata et al. ............. 345/100 |
| 2006/0279513 A1 | 12/2006 | Chung |
| 2007/0194973 A1* | 8/2007 | Nakao et al. ................... 341/155 |
| 2008/0109605 A1* | 5/2008 | Ko et al. ....................... 711/122 |
| 2009/0058773 A1* | 3/2009 | Chang ............................ 345/87 |
| 2009/0167742 A1* | 7/2009 | Nakagawa et al. ........... 345/211 |
| 2010/0033417 A1 | 2/2010 | Shu |
| 2011/0227899 A1* | 9/2011 | Shim ............................. 345/211 |
| 2012/0050146 A1* | 3/2012 | Tanaka et al. .................... 345/92 |

FOREIGN PATENT DOCUMENTS

| JP | 10-84274 A | 3/1998 |
|---|---|---|
| JP | 2005-321510 A | 11/2005 |
| JP | 2006-338027 A | 12/2006 |
| JP | 2010-39208 A | 2/2010 |

* cited by examiner

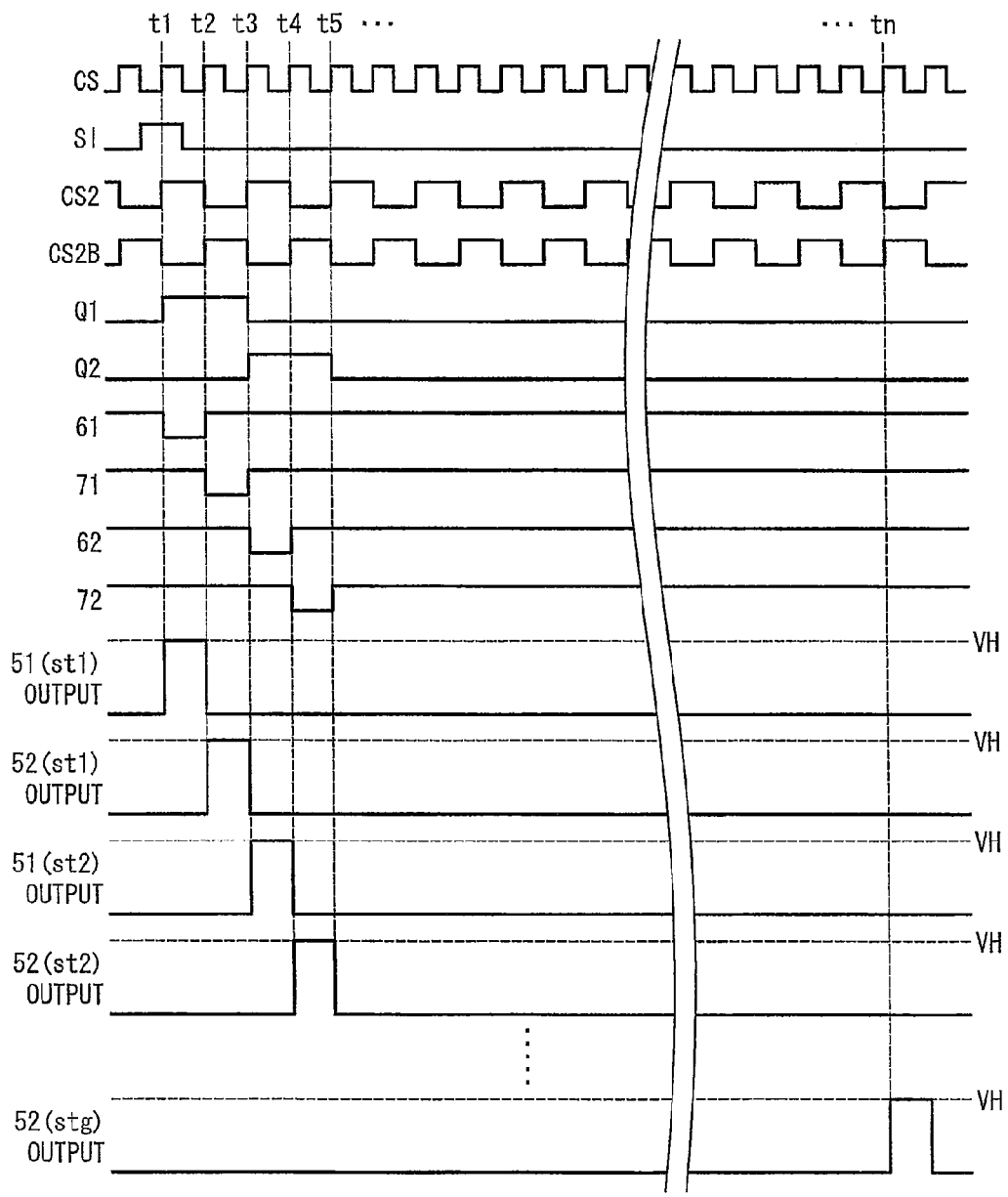

F I G. 5
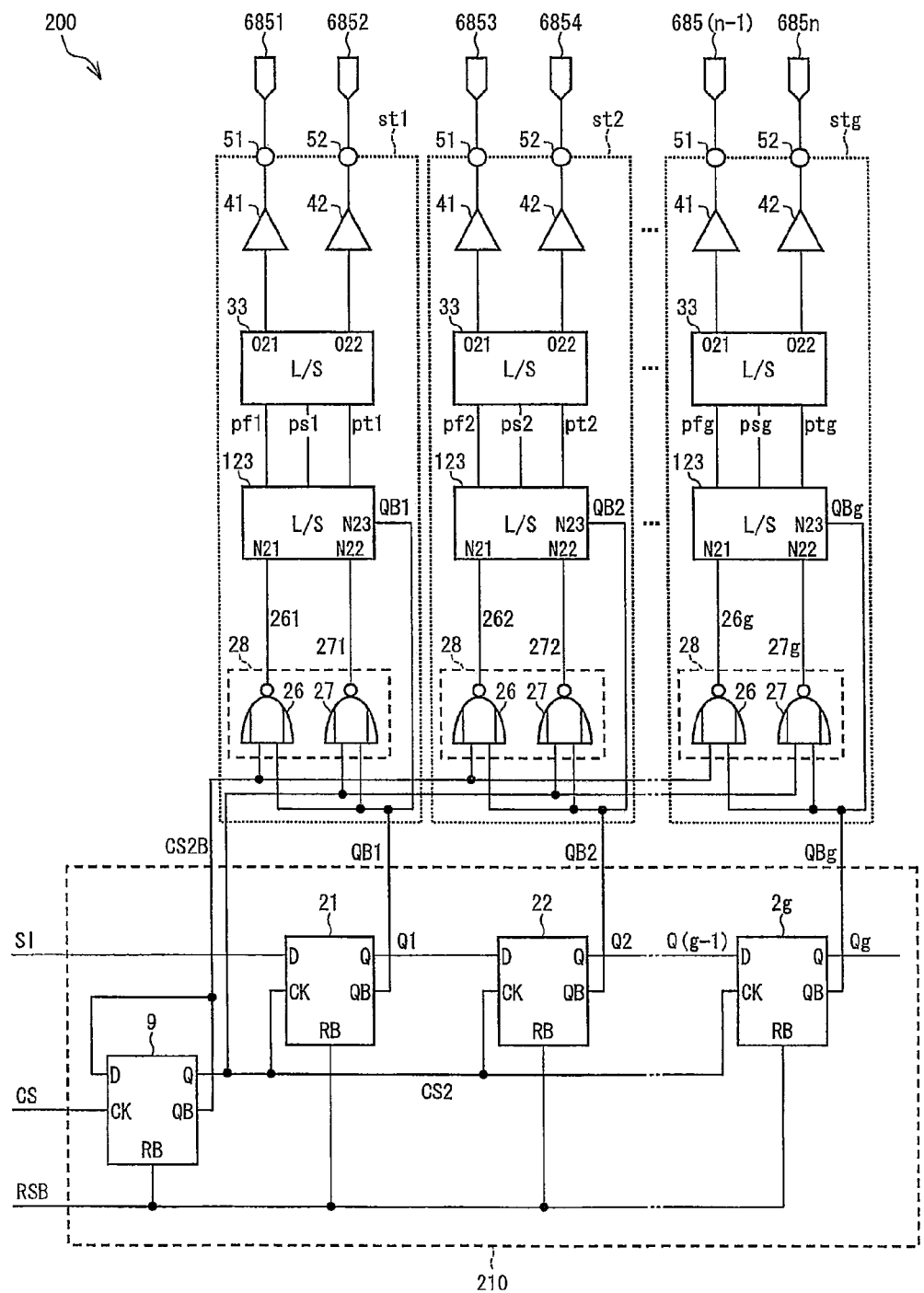

F I G. 7
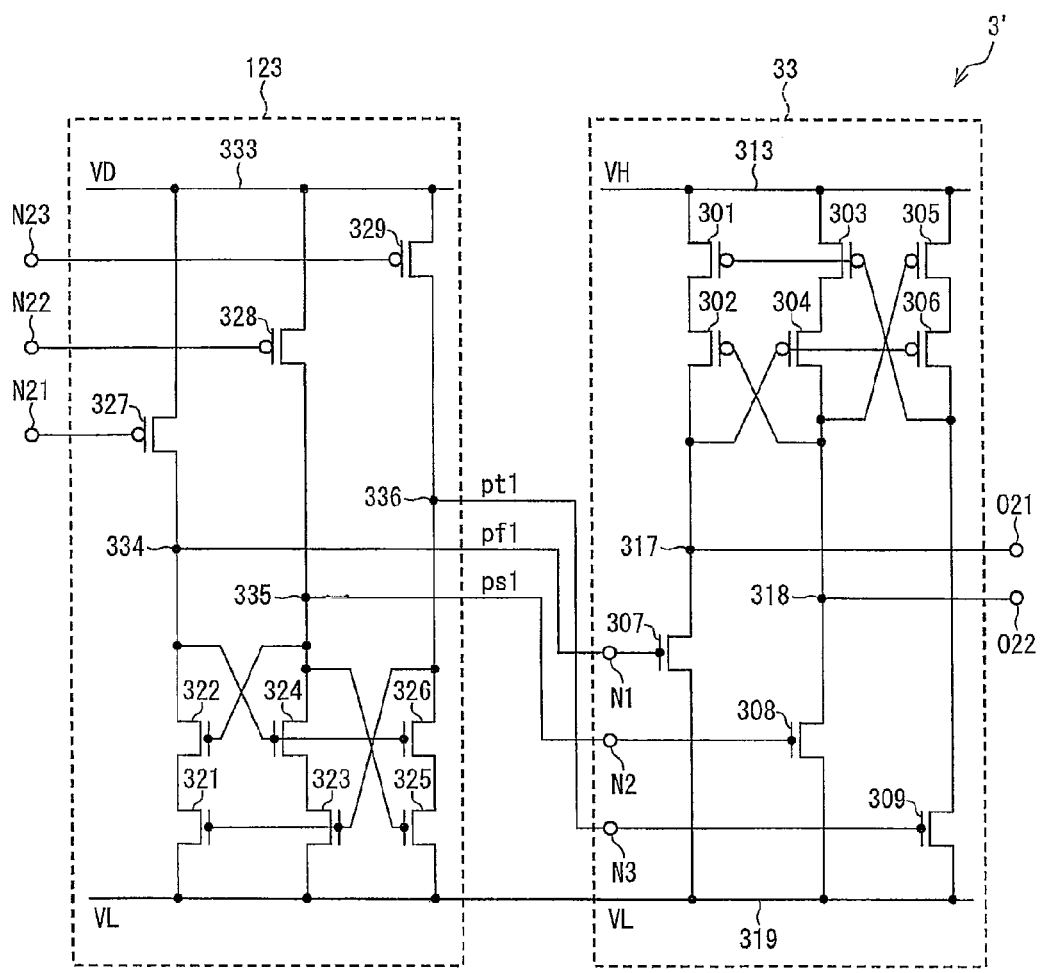

F I G. 1 9   Conventional Art

F I G. 2 3
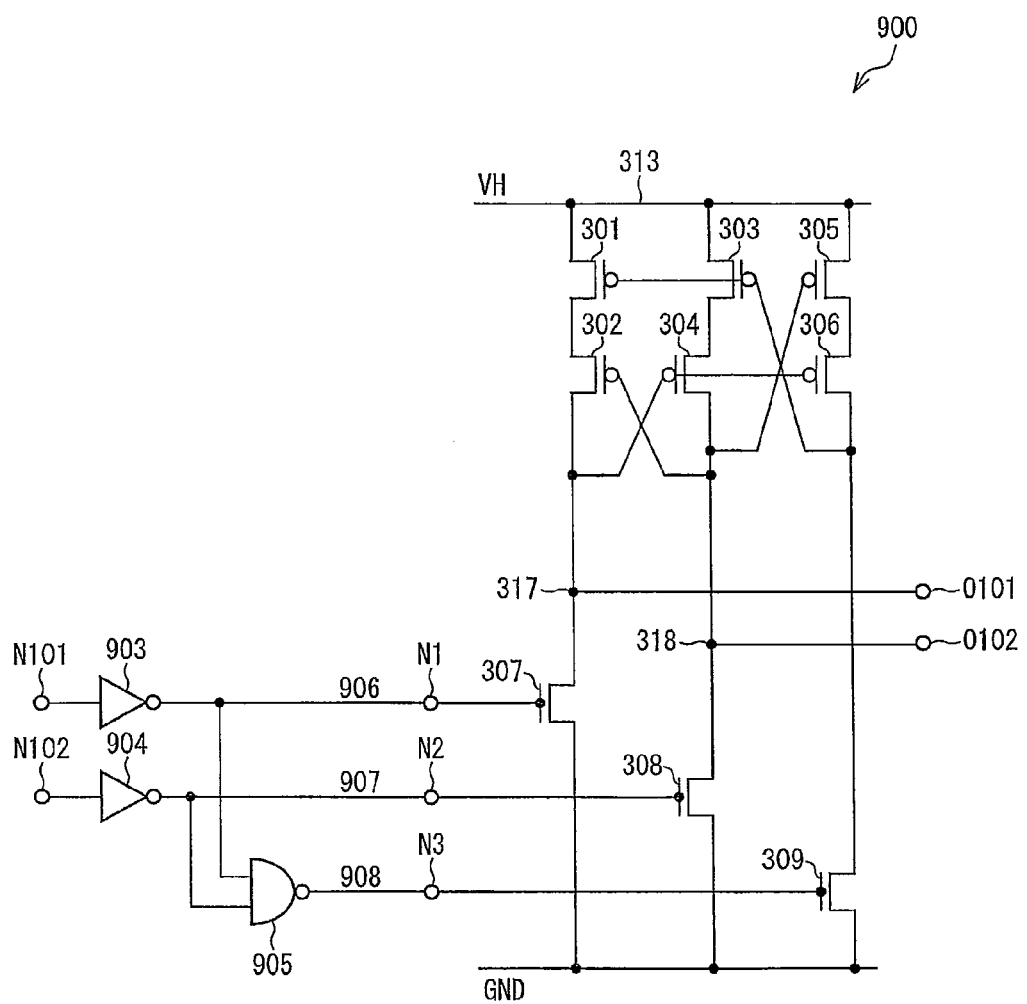

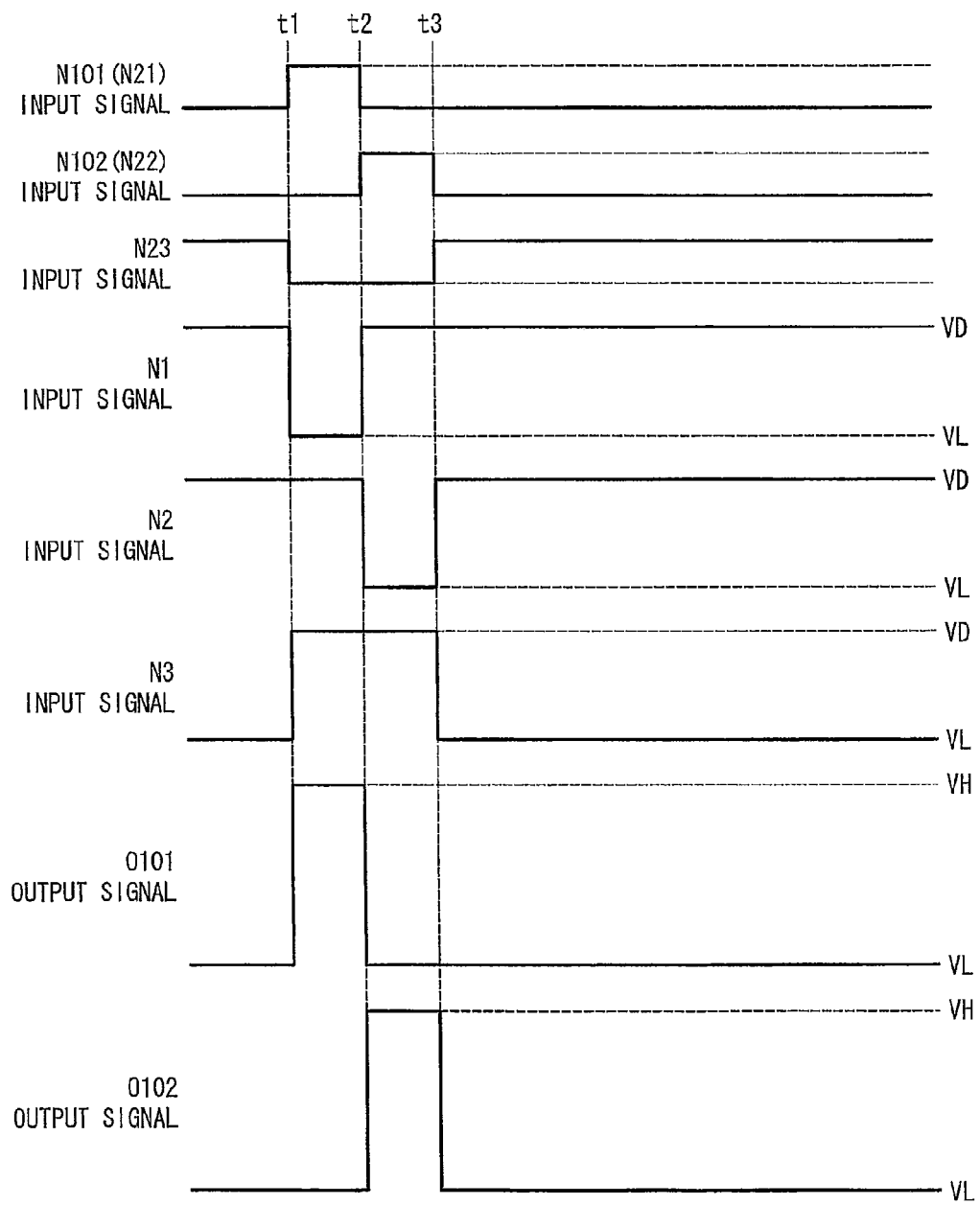

F I G. 2 7
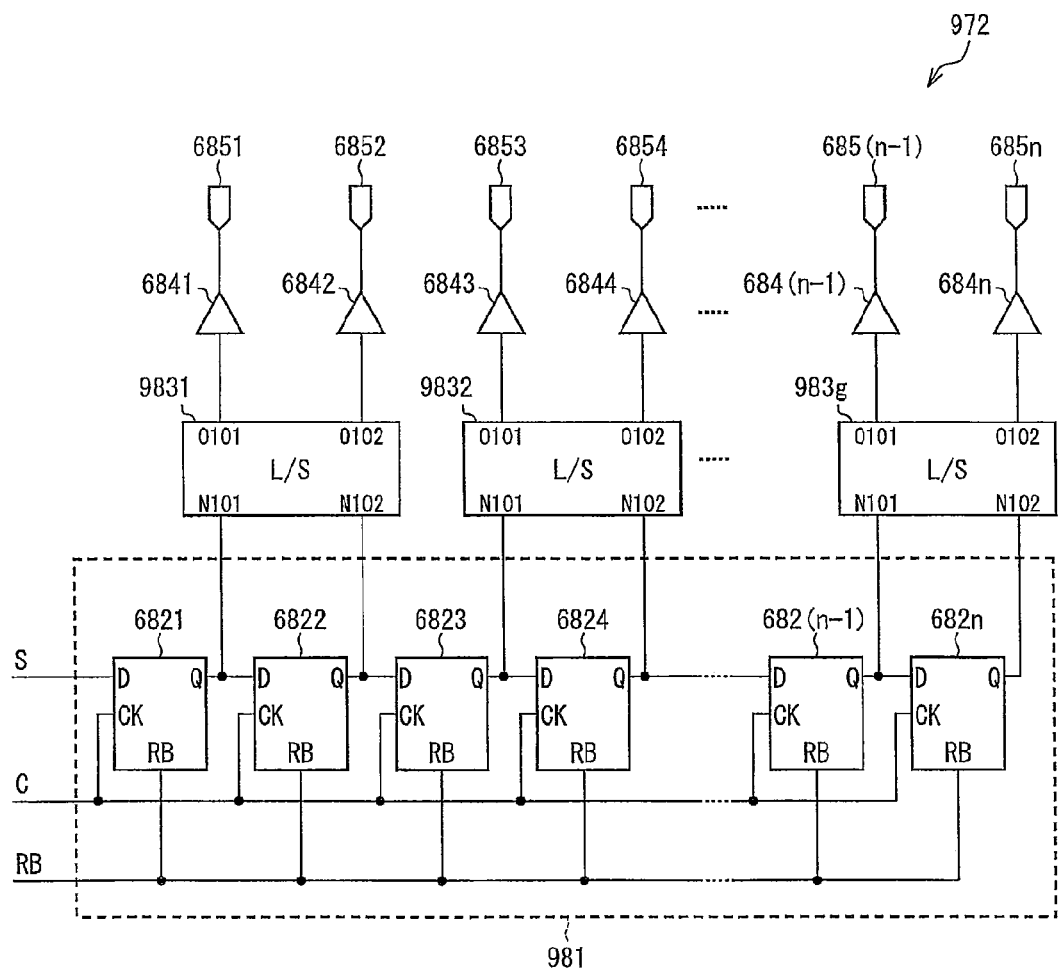

US 8,743,045 B2

LEVEL SHIFTER CIRCUIT, SCANNING LINE DRIVER AND DISPLAY DEVICE

TECHNICAL FIELD

The present invention relates to a level shifter circuit which converts a pulse into a binary voltage signal having predetermined voltage levels (high level and low level). Further, the present invention relates to (i) a scanning line drive device including: a shift register circuit which outputs a reference pulse according to which a plurality of scanning lines are sequentially driven; and a level shifter circuit which converts the reference pulse into a binary voltage signal having a voltage level suitable for carrying out a display on a display device and (ii) a display device including the scanning line drive device. The present invention particularly relates to a level shifter circuit, a scanning line drive device and a display device each of which is for use in an active matrix display device.

BACKGROUND ART

Conventionally, a gate driver included in a display device such as an active matrix liquid crystal display device, which gate driver serves as a scanning line drive device, has the following problem. That is, the circuit scale and production costs are large because the gate driver requires (i) in a shift register circuit, as many latch circuits as scanning lines (horizontal lines) to be driven, which latch circuits output pulses according to which the scanning lines are sequentially driven and (ii) as many level shifter circuits as the scanning lines, which level shifter circuits convert the pulses into voltage signals each having a voltage level suitable for carrying out a display on the display device.

In view of this, according to Patent Literature 1, X scanning lines are divided into groups each of which has Y scanning lines, on-voltage and off-voltage are supplied to the groups, and the groups whose scanning lines are to be driven are switched over by control means 821 and switching means 822 (refer to FIG. 22). This allows a liquid crystal display device to drive the scanning lines with use of drive outputs fewer than the scanning lines. That is, the liquid crystal display device is capable of driving the scanning lines with use of (i) the level shifter circuits fewer than the scanning lines and (ii) as many scanning line drive signal generation circuits as the level shifter circuits.

Meanwhile, a level shifter circuit includes a switch, which is for controlling conversion of a pulse into a voltage signal by switching between conductive and nonconductive states in accordance with an input signal serving as a logic signal. Generally, such a switch is constituted by an n-channel MOS (Metal Oxide Semiconductor) transistor whose gate terminal receives the input signal. Note here that, in a level shifter circuit, a voltage applied to a gate terminal of an n-channel MOS transistor, which serves as a switch, is small. Therefore, in order to achieve a desired operation speed, it is necessary to increase the width of the gate terminal (refer to Patent Literature 2).

CITATION LIST

Patent Literatures

Patent Literature 1
Japanese Patent Application Publication, Tokukaihei, No. 05-313129 A (Publication Date: Nov. 26, 1993)
Patent Literature 2
Japanese Patent Application Publication, Tokukaihei, No. 10-84274 A (Publication Date: Mar. 31, 1998)

SUMMARY OF INVENTION

Technical Problem

According to the foregoing technique disclosed in Patent Literature 1, it is possible to reduce the number of the drive outputs. However, it is essential that the technique include the control means 821 and the switching means 822 for selecting a group whose scanning lines are to be driven, various circuits for controlling the control means 821 and the switching means 822, and a voltage generation circuit for supplying off-voltage to a group whose scanning lines are not to be driven. This causes a problem that it is not possible to significantly reduce the circuit scale and production costs.

Further, in a case of applying the technique disclosed in Patent Literature 2 to a level shifter circuit, one (1) level shifter circuit having at least three switches (i.e., re-channel MOS transistors) is necessary to drive one (1) scanning line. As described earlier, in order to achieve a desired operation speed of the level shifter circuit, it is necessary to increase the width of the gate terminal of each of the n-channel MOS transistors, which serve as the switches. Under such circumstances, if the number of these n-channel MOS transistors can be reduced, it should be possible to further reduce the circuit scales and production costs of the level shifter circuit, a scanning line drive device, and a display device.

The present invention was made in view of the above problem, and an object of the present invention is to provide a level shifter circuit, a scanning line drive device, and a display device, each of which makes it possible to further reduce the circuit scale and thus to reduce production costs.

Solution to Problem

In order to attain the above object, a scanning line drive device in accordance with the present invention is a scanning line drive device for supplying signals for driving a plurality of scanning lines, including: a shift register circuit adapted to operate in accordance with a frequency-divided clock obtained by dividing the frequency of an operating clock by two supplied to the scanning line drive device; a pulse generation circuit for generating, in accordance with an output signal received from the shift register circuit, (i) a reference pulse indicative of a period during which two successive scanning lines are not to be driven and a period during which the two successive scanning lines are to be driven, (ii) a first pulse indicative of a first period during which one of the two successive scanning lines is to be driven, which first period is part of the period during which the two successive scanning lines are to be driven, and (iii) a second pulse indicative of a second period during which the other one of the two successive scanning lines is to be driven, which second period is part of the period during which the two successive scanning lines are to be driven; and a level shifter circuit having first to third input terminals, first and second output terminals, first and second power supplies which apply voltages of respective different levels, and first to ninth transistors, wherein, in the level shifter circuit, a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, and the source terminal of the second transistor is connected with the drain terminal of the first transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, and the source terminal of the fourth transistor is connected with the drain terminal of the third transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, and the source terminal of the sixth transistor is connected with the drain terminal of the fifth transistor, a gate terminal of the seventh transistor is connected with the first input terminal, the drain terminal of the seventh transistor is connected with the drain terminal of the second transistor, and a source terminal of the seventh transistor is connected with the second power supply, a gate terminal of the eighth transistor is connected with the second input terminal, the drain terminal of the eighth transistor is connected with the drain terminal of the fourth transistor, and a source terminal of the eighth transistor is connected with the second power supply, a gate terminal of the ninth transistor is connected with the third input terminal, the drain terminal of the ninth transistor is connected with the drain terminal of the sixth transistor, and a source terminal of the ninth transistor is connected with the second power supply, and the first output terminal is connected with the drain terminal of the seventh transistor, and the second output terminal is connected with the drain terminal of the eighth transistor, wherein the first pulse is supplied to the first input terminal, the second pulse is supplied to the second input terminal, and the reference pulse is supplied to the third input terminal, and wherein, by the first pulse, the second pulse and the reference pulse, during the period during which the two successive scanning lines are not to be driven, the ninth transistor is caused to be nonconductive and the seventh and eighth transistors are caused to be conductive, whereby a voltage signal having a voltage level corresponding to a voltage that the second power supply applies is outputted from each of the first and second output terminals, during the first period, the seventh transistor is caused to be nonconductive and the eighth and ninth transistors are caused to be conductive, whereby a voltage signal having a voltage level corresponding to a voltage that the first power supply applies is outputted from the first output terminal and a voltage signal having a voltage level corresponding to a voltage that the second power supply applies is outputted from the second output terminal, and during the second period, the eighth transistor is caused to be nonconductive and the seventh and ninth transistors are caused to be conductive, whereby a voltage signal having a voltage level corresponding to a voltage that the second power supply applies is outputted from the first output terminal and a voltage signal having a voltage level corresponding to a voltage that the first power supply applies is outputted from the second output terminal.

According to the configuration, the scanning line drive device is capable of obtaining, from one (1) output signal supplied from the shift register circuit, two different voltage signals that are outputted from the level shifter circuit and are for use in sequentially driving the scanning lines in a display device. This makes it possible to reduce the scale of the circuits (latch circuit etc.) for generating output signals in the shift register circuit. Further, the scanning line drive device supplies a voltage signal to each scanning line by use of (i) the pulse generation circuit simply constituted by for example a combination of a latch circuit and a simple logic circuit and (ii) the level shifter circuit adapted to correspond to the output from the pulse generation circuit. Therefore, it is not necessary for the scanning line drive device to include control means and switching means, various circuits for controlling the control means and the switching means, and a voltage generation circuit for supplying off-voltage to a group whose scanning lines are not to be driven, which are in accordance with the conventional technique in which the scanning lines to be driven are divided into groups and the groups are selected and controlled so that the scanning lines included therein are driven or not driven. Accordingly, the scanning line drive device makes it possible to reduce the circuit scale and thus to reduce production costs.

Further, according to the configuration, the level shifter circuit of the scanning line drive device is capable of generating, in accordance with the first and second pulses and the reference pulse from the pulse generation circuit, two different outputs suitable for driving two successive scanning lines that are to be sequentially driven.

In order to attain the above object, a level shifter circuit in accordance with the present invention is a level shifter circuit, including: first to third input terminals, first and second output terminals; first and second power supplies which apply voltages of respective different levels; and first to ninth transistors, wherein a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, and the source terminal of the second transistor is connected with the drain terminal of the first transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, and the source terminal of the fourth transistor is connected with the drain terminal of the third transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, and the source terminal of the sixth transistor is connected with the drain terminal of the fifth transistor, a gate terminal of the seventh transistor is connected with the first input terminal, the drain terminal of the seventh transistor is connected with the drain terminal of the second transistor, and a source terminal of the seventh transistor is connected with the second power supply, a gate terminal of the eighth transistor is connected with the second input terminal, the drain terminal of the eighth transistor is connected with the drain terminal of the fourth transistor, and a source terminal of the eighth transistor is connected with the second power supply, and a gate terminal of the ninth transistor is connected with the third input terminal, the drain terminal of the ninth transistor is connected with the drain terminal of the sixth transistor, and a source terminal of the ninth transistor is connected with the second power supply, wherein the first output terminal is connected with the drain terminal of the seventh transistor, and the second output terminal is connected with the drain terminal of the eighth transistor, wherein pulses that selectively cause two of the seventh to ninth transistors to be conductive are supplied to the respective gate terminals of the respective seventh to ninth transistors, wherein, while the ninth transistor is nonconductive and the seventh and eighth transistors are conductive, a voltage signal having a voltage level corresponding to a voltage that the second power supply applies is outputted from each of the first and second output terminals, wherein, while the seventh transistor is nonconductive and the eighth and ninth transistors are conductive, a voltage signal having a voltage level corresponding to a voltage that the first power supply applies is outputted from the first output terminal, and a voltage signal having a voltage level corresponding to a voltage that the second power supply applies is outputted from the second output terminal, and w herein, while the eighth transistor is nonconductive and the seventh and ninth transistors are conductive, a voltage signal having a voltage level corresponding to a voltage that the second power supply applies is outputted from the first output terminal, and a voltage signal having a voltage level corresponding to a voltage that the first power supply applies is outputted from the second output terminal.

According to the configuration, the level shifter circuit is capable of outputting, from each of the first and second output terminals, a voltage signal for driving one (1) scanning line. In other words, the level shifter circuit includes three switches, i.e., the seventh to ninth transistors, for driving two scanning lines. This makes it possible to reduce the number of n-channel MOS transistors in the level shifter circuit as compared to a level shifter circuit to which the technique disclosed in Patent Literature 2 is applied, which technique requires at least three switches (n-channel MOS transistors) for driving one (1) scanning line. Accordingly, the level shifter circuit makes it possible to reduce the circuit scale and thus to reduce production costs.

Advantageous Effects of Invention

As has been described, a scanning line drive device in accordance with the present invention is a scanning line drive device for supplying signals for driving a plurality of scanning lines, including: a shift register circuit adapted to operate in accordance with a frequency-divided clock obtained by dividing the frequency of an operating clock by two supplied to the scanning line drive device; a pulse generation circuit for generating, in accordance with an output signal received from the shift register circuit, (i) a reference pulse indicative of a period during which two successive scanning lines are not to be driven and a period during which the two successive scanning lines are to be driven, (ii) a first pulse indicative of a first period during which one of the two successive scanning lines is to be driven, which first period is part of the period during which the two successive scanning lines are to be driven, and (iii) a second pulse indicative of a second period during which the other one of the two successive scanning lines is to be driven, which second period is part of the period during which the two successive scanning lines are to be driven; and a level shifter circuit having first to third input terminals, first and second output terminals, first and second power supplies which apply voltages of respective different levels, and first to ninth transistors, wherein, in the level shifter circuit, a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, and the source terminal of the second transistor is connected with the drain terminal of the first transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, and the source terminal of the fourth transistor is connected with the drain terminal of the third transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, and the source terminal of the sixth transistor is connected with the drain terminal of the fifth transistor, a gate terminal of the seventh transistor is connected with the first input terminal, the drain terminal of the seventh transistor is connected with the drain terminal of the second transistor, and a source terminal of the seventh transistor is connected with the second power supply, a gate terminal of the eighth transistor is connected with the second input terminal, the drain terminal of the eighth transistor is connected with the drain terminal of the fourth transistor, and a source terminal of the eighth transistor is connected with the second power supply, a gate terminal of the ninth transistor is connected with the third input terminal, the drain terminal of the ninth transistor is connected with the drain terminal of the sixth transistor, and a source terminal of the ninth transistor is connected with the second power supply, and the first output terminal is connected with the drain terminal of the seventh transistor, and the second output terminal is connected with the drain terminal of the eighth transistor, wherein the first pulse is supplied to the first input terminal, the second pulse is supplied to the second input terminal, and the reference pulse is supplied to the third input terminal, and wherein, by the first pulse, the second pulse and the reference pulse, during the period during which the two successive scanning lines are not to be driven, the ninth transistor is caused to be nonconductive and the seventh and eighth transistors are caused to be conductive, whereby a voltage signal having a voltage level corresponding to a voltage that the second power supply applies is outputted from each of the first and second output terminals, during the first period, the seventh transistor is caused to be nonconductive and the eighth and ninth transistors are caused to be conductive, whereby a voltage signal having a voltage level corresponding to a voltage that the first power supply applies is outputted from the first output terminal and a voltage signal having a voltage level corresponding to a voltage that the second power supply applies is outputted from the second output terminal, and during the second period, the eighth transistor is caused to be nonconductive and the seventh and ninth transistors are caused to be conductive, whereby a voltage signal having a voltage level corresponding to a voltage that the second power supply applies is outputted from the first output terminal and a voltage signal having a voltage level corresponding to a voltage that the first power supply applies is outputted from the second output terminal.

Further, a level shifter circuit in accordance with the present invention is a level shifter circuit, including: first to third input terminals; first and second output terminals; first and second power supplies which apply voltages of respective different levels; and first to ninth transistors, wherein a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, and the source terminal of the second transistor is connected with the drain terminal of the first transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, and the source terminal of the fourth transistor is connected with the drain terminal of the third transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, and the source terminal of the sixth transistor is connected with the drain terminal of the fifth transistor, a gate terminal of the seventh transistor is connected with the first input terminal, the drain terminal of the seventh transistor is connected with the drain terminal of the second transistor, and a source terminal of the seventh transistor is connected with the second power supply, a gate terminal of the eighth transistor is connected with the second input terminal, the drain terminal of the eighth transistor is connected with the drain terminal of the fourth transistor, and a source terminal of the eighth transistor is connected with the second power supply, and a gate terminal of the ninth transistor is connected with the third input terminal, the drain terminal of the ninth transistor is connected with the drain terminal of the sixth transistor, and a source terminal of the ninth transistor is connected with the second power supply, wherein the first output terminal is connected with the drain terminal of the seventh transistor, and the second output terminal is connected with the drain terminal of the eighth transistor, wherein pulses that selectively cause two of the seventh to ninth transistors to be conductive are supplied to the respective gate terminals of the respective seventh to ninth transistors, wherein, while the ninth transistor is nonconductive and the seventh and eighth transistors are conductive, a voltage signal having a voltage level corresponding to a voltage that the second power supply applies is outputted from each of the first and second output terminals, wherein, while the seventh transistor is nonconductive and the eighth and ninth transistors are conductive, a voltage signal having a voltage level corresponding to a voltage that the first power supply applies is outputted from the first output terminal, and a voltage signal having a voltage level corresponding to a voltage that the second power supply applies is outputted from the second output terminal, and wherein, while the eighth transistor is nonconductive and the seventh and ninth transistors are conductive, a voltage signal having a voltage level corresponding to a voltage that the second power supply applies is outputted from the first output terminal, and a voltage signal having a voltage level corresponding to a voltage that the first power supply applies is outputted from the second output terminal.

Accordingly, the present invention brings about an effect of further reducing the circuit scale and thus to further reduce production costs.

BRIEF DESCRIPTION OF DRAWINGS

FIG. 2 is a timing chart illustrating how the scanning line drive device shown in FIG. 1 operates.

FIG. 5 is a view illustrating a circuit configuration of a scanning line drive device in accordance with another embodiment of the present invention.

FIG. 7 is a view illustrating another example of the circuit configuration of the level shifter circuit in accordance with the present invention.

FIG. 23 is a view illustrating a circuit configuration of a level shifter circuit in accordance with an embodiment of the present invention.

FIG. 26 is a timing chart illustrating how the level shifter circuit shown in FIG. 25 generates voltage signals.

FIG. 27 is a view illustrating a circuit configuration of a scanning line drive device including a level shifter circuit in accordance with the present invention.

DESCRIPTION OF EMBODIMENTS

[Premise of the Invention]

Figure 17:
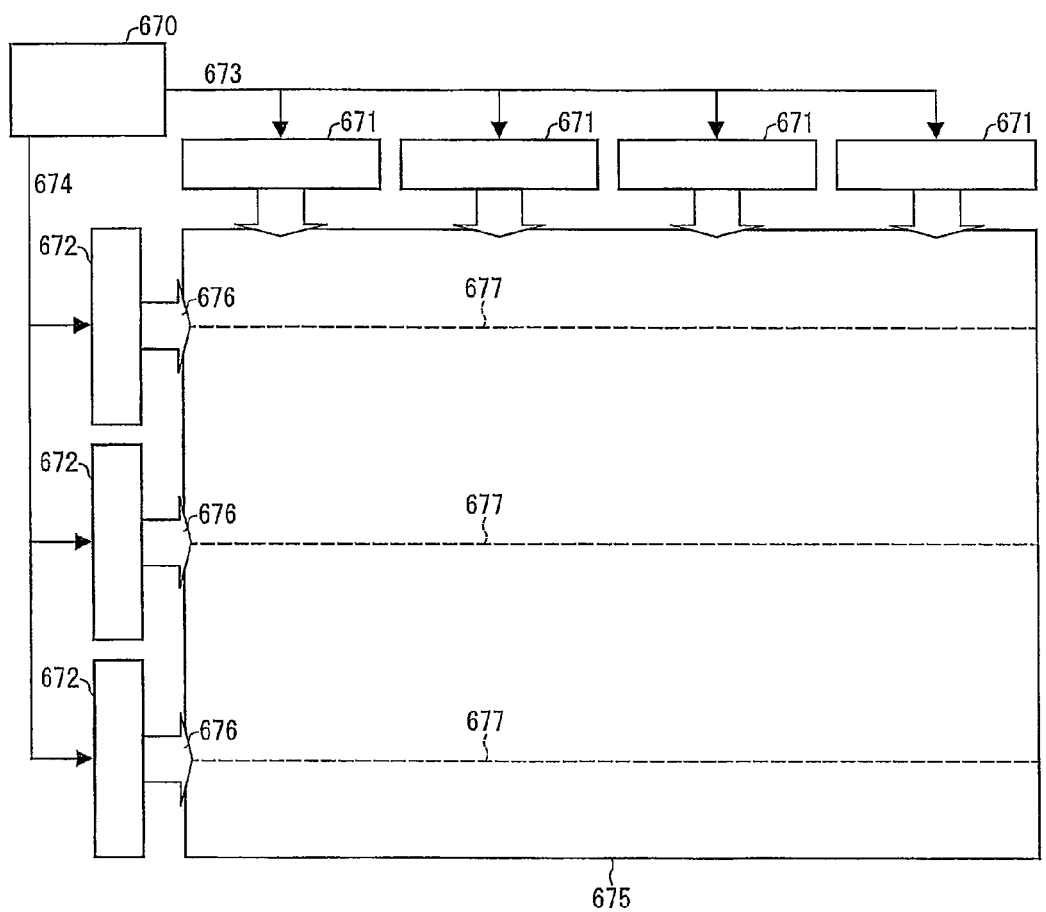
FIG. 17 is a view schematically illustrating how a display device is configured, and is a view schematically illustrating how an active matrix liquid crystal display device is configured.

FIG. 17 schematically illustrates an active matrix liquid crystal display device.

The active matrix liquid crystal display device includes a plurality of scanning lines 677 each of which extends in a row direction and a plurality of data signal lines (not illustrated) each of which extends in a column direction. TFTs (Thin Film Transistor) are provided at respective intersections of the scanning lines 677 and the data signal lines. Each of the TFTs has a gate terminal connected with a corresponding one of the scanning lines 677, a drain terminal connected with a corresponding liquid crystal picture element (not illustrated), and a source terminal connected with a corresponding one of the data signal lines. Generally, as illustrated in FIG. 17, first, each source driver 671 of the liquid crystal display device takes data for one (1) horizontal period out of a source driver control signal (reference number 673) and image data, and stores the data. The data thus stored is converted into an analog signal representing a gray scale level by a digital-to-analog converter (DA conversion) (not illustrated), and then supplied to a corresponding one of the data signal lines.

On the other hand, gate drivers 672 serving as scanning line drive devices output signals for sequentially selecting the scanning lines 677 in a liquid crystal display panel 675. Each of the gate drivers 672 receives a gate driver control signal (reference number 674) supplied from a control circuit 670, such signal as a start pulse indicative of a start of displaying in a vertical direction of the liquid crystal display panel 675, and causes a scanning line drive circuit (not illustrated) included therein to operate to generate, from the gate driver control signal, a scanning line drive signal 676 for driving a corresponding one of the scanning lines 677.

Each of the TFTs becomes conductive when a scanning line 677 connected thereto is selected by the scanning line drive signal 676. Then, a liquid crystal picture element corresponding to the scanning line 677 thus selected receives the analog signal supplied through a corresponding one of the data signal lines.

When the foregoing series of operations have been carried out with respect to all the scanning lines 677, displaying is completed on the liquid crystal display device shown in FIG. 17. Further, the liquid crystal display device shown in FIG. 17 achieves displaying of various images and videos by continuously carrying out, for every frame over a period of time, the foregoing series of operations that end with the completion of the displaying which operations serve as one (1) frame.

Figure 18:
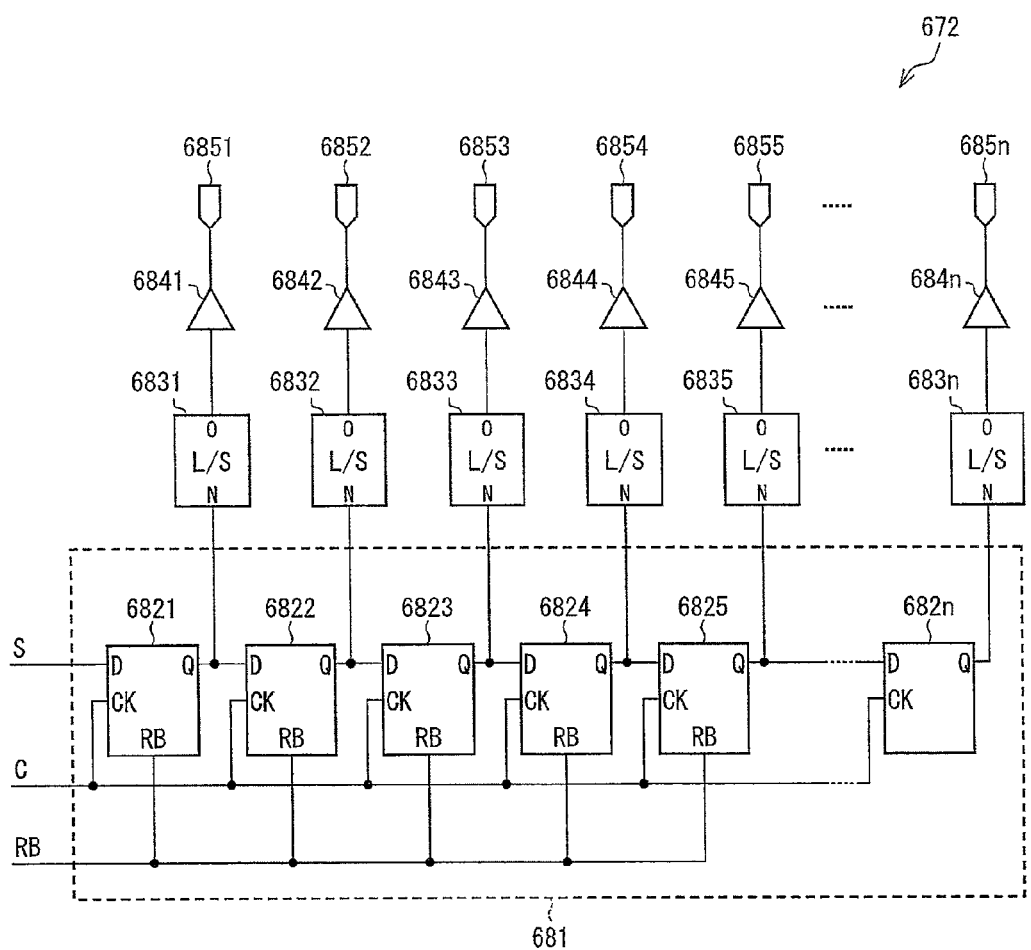
FIG. 18 is a view illustrating an example of a circuit configuration of a conventionally known scanning line drive circuit which generates and outputs pulses for sequentially driving scanning lines.

FIG. 18 illustrates an example of a circuit configuration of a conventionally known gate driver 672, which generates and outputs pulses for sequentially driving the scanning lines 677 (refer to FIG. 17).

The reference number 681 is indicative of a shift register circuit constituted by connecting n latch circuits 682. For convenience of description, the latch circuits 682 are additionally provided with respective reference numbers 1 to n such that the latch circuits 682 in the first to nth stages are referred to as the latch circuit 6821, the latch circuit 6822, . . . , and the latch circuit 682n, respectively. The latch circuits 682 of the gate driver 672 shown in FIG. 18 are general D-FF (Delay-Flip-Flop) circuits.

Each output terminal of the shift register circuit 681 is connected with a level shifter circuit 683, a buffer circuit 684, and an output terminal 685, in this order. For convenience of description, the level shifter circuits 683, the buffer circuits 684, and the output terminals 685 are each additionally provided with reference numbers 1 to n, in the same manner as in the case of the latch circuits 682 of the shifter register circuit 681.

Figure 19:
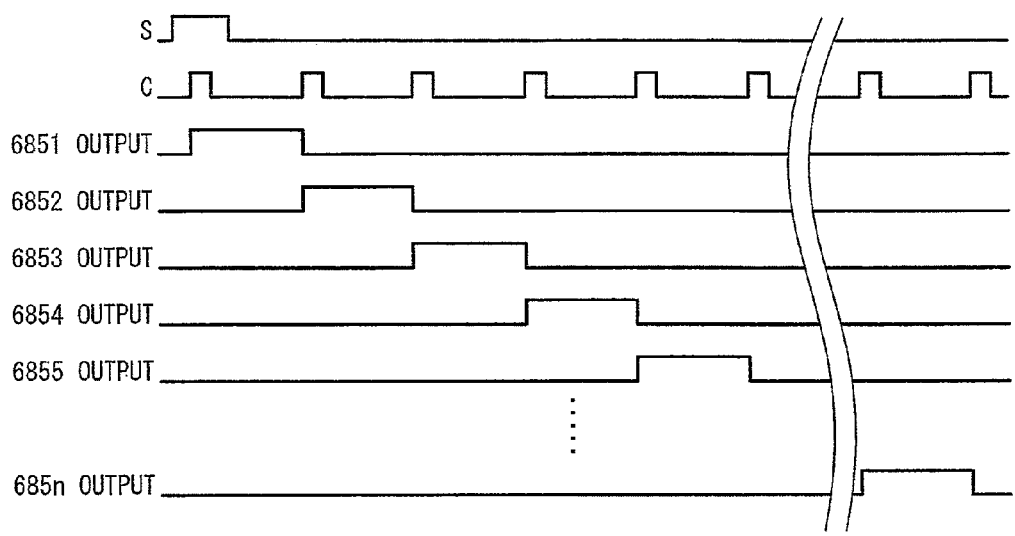
FIG. 19 is a timing chart illustrating how the scanning line drive device sequentially shifts pulses in synchronization with a drive clock.

FIG. 19 is a timing chart illustrating the timings of operations in FIG. 18 (how the gate driver 672 sequentially shifts pulses in synchronization with a drive clock C).

The shift register circuit 681 operates in accordance with a start signal S and a drive clock C supplied thereto.

As illustrated in FIG. 19, the shift register circuit 681 operates as below. After a pulse is applied as a start signal S, at the timing at which the drive clock C rises from a low level (a low level of a binary signal, hereinafter referred to as "L") to a high level (a high level of the binary signal, hereinafter referred to as "H"), output from the latch circuit 6821 in the first stage becomes "H". The "H" signal outputted from the latch circuit 6821 is converted by the level shifter circuit 6831 into a voltage signal having a voltage level enough for liquid crystal drive. The voltage signal passes through the buffer circuit 6841, and then is outputted from the output terminal 6851 (refer to chart 6851 shown in FIG. 19). The voltage signal is outputted as a scanning line drive signal 676 (refer to FIG. 17) for driving one (1) scanning line 677 (refer to FIG. 17).

In the shift register circuit 681, the latch circuits 6822 to 682n in the second to nth states also sequentially output pulses at the timings of rising edges of the drive clock C. The pulses thus outputted sequentially are converted into voltage signals by the respective level shifter circuits 6832 to 683n. Thereafter, the voltage signals pass through the respective buffer circuits 6842 to 684n, and are outputted from the respective output terminals 6852 to 685n. Timings at which the voltage signals are outputted from the respective output terminals 6851 to 685n are shown in FIG. 19. According to the timing chart shown in FIG. 19, the voltage signals are outputted sequentially from the respective output terminals 6851 to 685n at the timings of rising edges of the drive clock C such that a voltage signals is outputted from the output terminal 6851, a voltage signal is outputted from the output terminal 6852, . . . , and then a voltage signal is outputted from the output terminal 685n.

Figure 20:
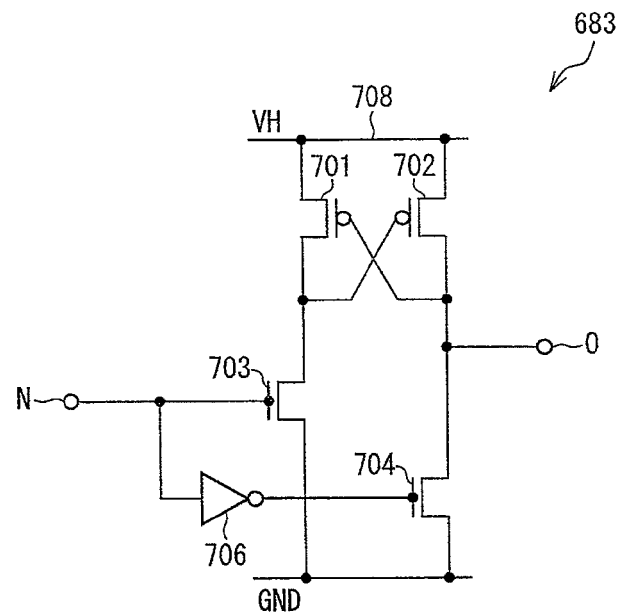
FIG. 20 is a view illustrating an example of a circuit configuration of a level shifter circuit, which is a premise of the present invention.

FIG. 20 illustrates an example of a circuit configuration of the level shifter circuit 683. Note that a voltage VH has a value corresponding to "H" of the scanning line drive signal 676 (refer to FIG. 17), which value is greater than a value corresponding to "H" of an input signal from a corresponding latch circuit 682.

The level shifter circuit 683 shown in FIG. 20 is constituted by four MOS transistors 701 to 704, each of which withstands voltages equal to and greater than the voltage VH. Note that the transistors 701 and 702 are p-channel transistors, and the transistors 703 and 704 are n-channel transistors. Further, the W/L (width of gate terminal/length of gate terminal) of each of the transistors 701 and 702 is 5.0/9.6, and the W/L of each of the transistors 703 and 704 is 240.0/1.2. Note that the width W and the length L of each gate terminal are expressed in μm (micrometer).

The level shifter circuit 683 shown in FIG. 20 is configured as below. That is, an input terminal N (again refer to FIG. 18) is connected with a gate terminal of the transistor 703. A node connecting the input terminal N and the gate terminal of the transistor 703 is connected with an input terminal of an inverter 706. An output terminal of the inverter 706 is connected with a gate terminal of the transistor 704. A source terminal of each of the transistors 703 and 704 is connected with a ground line (GND). A drain terminal of the transistor 703 is connected with a drain terminal of the transistor 701. A drain terminal of the transistor 704 is connected with a drain terminal of the transistor 702. A source terminal of each of the transistors 701 and 702 is connected with a power supply line 708 to which the voltage VH is applied. The drain terminal of the transistor 701 is further connected with a gate terminal of the transistor 702, and the drain terminal of the transistor 702 is further connected with a gate terminal of the transistor 701. The drain terminal of the transistor 704 is further connected with an output terminal O (again refer to FIG. 18).

In the level shifter circuit 683 shown in FIG. 20, the gate terminal of the transistor 703 receives an input signal from the input terminal N, and the gate terminal of the transistor 704 receives a signal obtained by logically inverting the input signal. The level shifter circuit 683 outputs an "L" output signal when the input signal is "L", and outputs an "H" output signal when the input signal is "H". Further, note that a voltage corresponding to the "H" output signal is the voltage VH. Accordingly, the input signal composed of "H" and "L" is converted into a voltage signal whose "H" corresponds to the voltage VH and "L" corresponds to a zero potential (GND potential), and the voltage signal is outputted as the output signal from the output terminal O.

The level shifter circuit 683 shown in FIG. 20 is suitably usable when a liquid crystal drive voltage for generating a voltage corresponding to "H" or "L" of the output signal is not a negative voltage. However, the level shifter circuit 683 does not take into consideration a case where the liquid crystal drive voltage is a negative voltage. The liquid crystal drive voltage is often a negative voltage. For example, a voltage corresponding to "L" of the output signal is −10 V, and a voltage corresponding to "H" of the output signal is +25 V. If this is the case, the level shifter circuit 683 shown in FIG. 20 is not considered to be suitable for use. According to a general logic circuit, a voltage corresponding to "H" is approximately 3 V, whereas a voltage corresponding to "L" is usually 0 V, i.e., zero potential.

In a case where a negative voltage should be used as the liquid crystal drive voltage, a level shifter circuit 683' circuit 683 shown in FIG. 20. Note here that the voltage VH is +25 V. The voltage VL has a value corresponding to "L" of a voltage signal serving as a scanning line drive signal 676 (refer to FIG. 17), which value is smaller (here, −10 V) than a value corresponding to "L" of the input signal from a corresponding latch circuit 682. The voltage VD is usually a voltage equivalent to "H" of the input signal, and is +3 V in FIG. 21.

Figure 21:
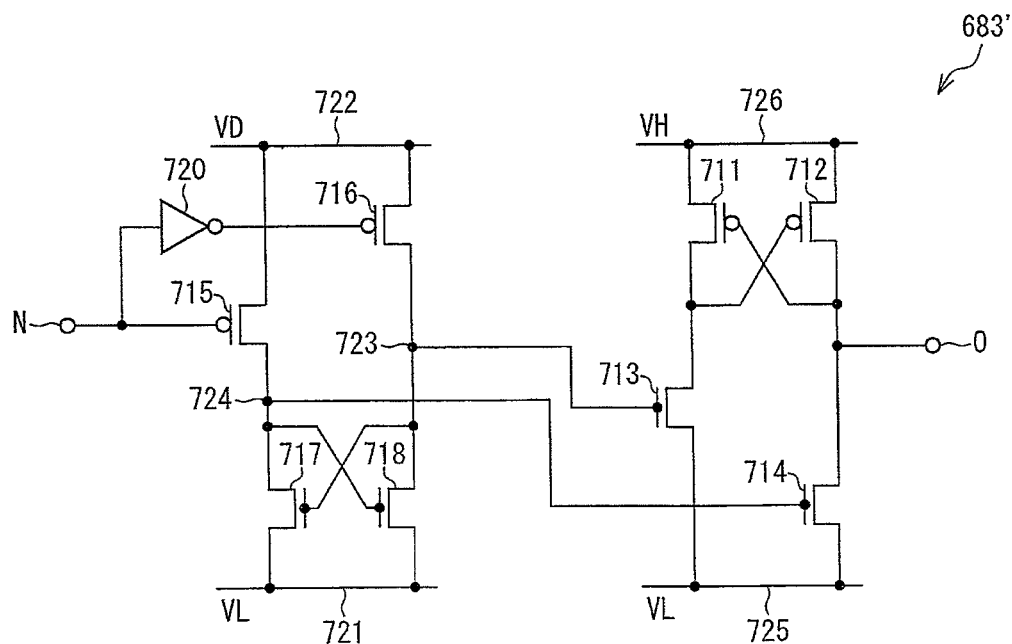
FIG. 21 is a view illustrating another example of the circuit configuration of the level shifter circuit, which is a premise of the present invention.
Figure 22:
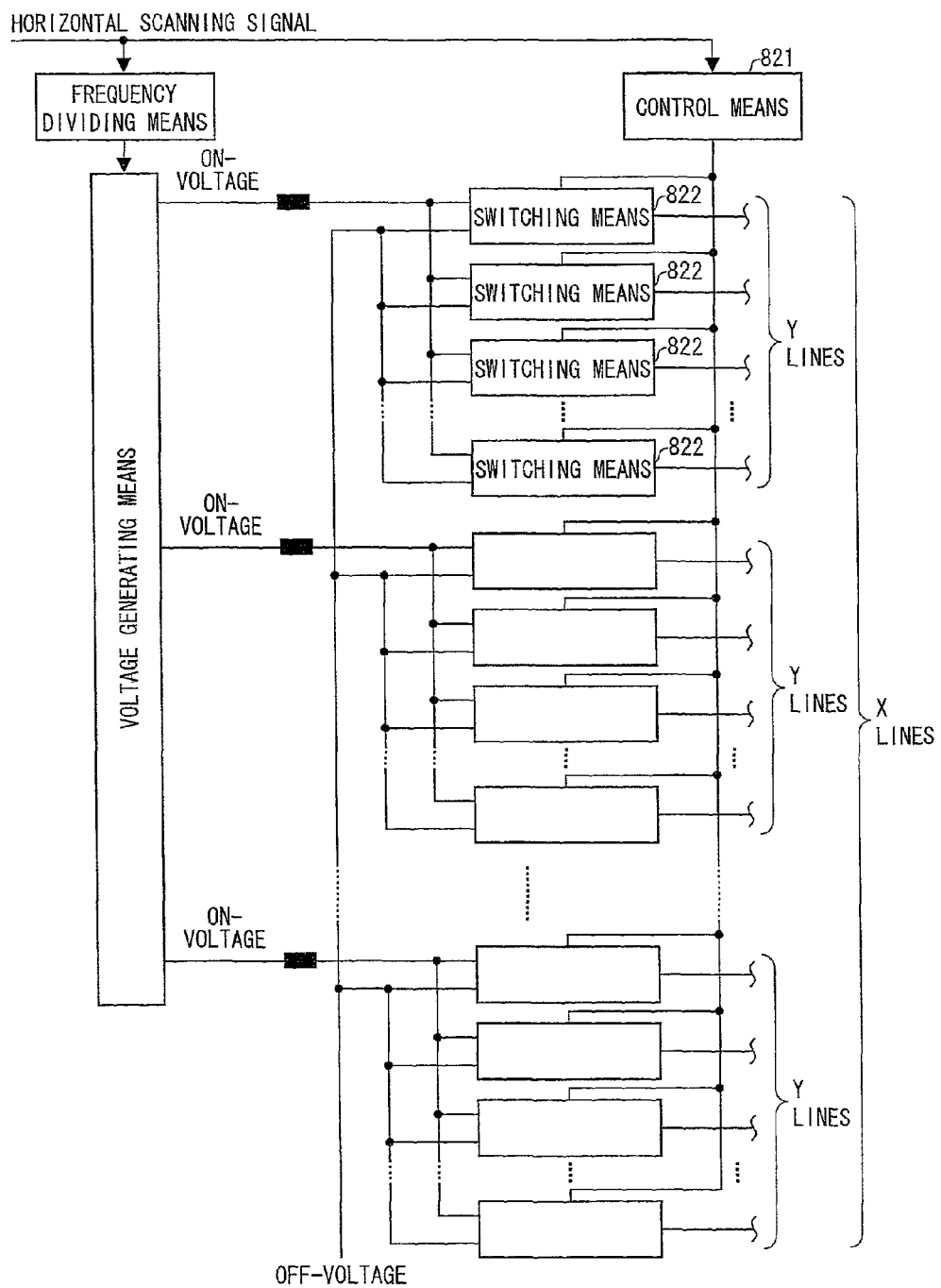
FIG. 22 is a block diagram schematically illustrating how a liquid crystal display device of a conventional art is configured.

The level shifter circuit 683' shown in FIG. 21 is constituted by eight MOS transistors 711 to 718, each of which withstands voltages equal to and greater than +35 V. The transistors 711, 712, 715 and 716 are p-channel transistors, and the transistors 713, 714, 717 and 718 are n-channel transistors. The W/L of each of the transistors 711 and 712 is 5.0/9.6. The W/L of each of the transistors 713 and 714 is 240.0/1.2. The W/L of each of the transistors 715 and 716 is 480.0/1.2. The W/L of each of the transistors 717 and 718 is 5.0/9.6.

The level shifter circuit 683' shown in FIG. 21 is configured as below. That is, an input terminal N (again refer to FIG. 18) is connected with a gate terminal of the transistor 715. A node connecting the input terminal N and the gate terminal of the transistor 715 is connected with an input terminal of an inverter 720. An output terminal of the inverter 720 is connected with a gate terminal of the transistor 716. A source terminal of each of the transistors 717 and 718 is connected with a power supply line 721 to which the voltage VL is applied. A drain terminal of the transistor 717 is connected with a drain terminal of the transistor 715. A drain terminal of the transistor 718 is connected with a drain terminal of the transistor 716. A source terminal of each of the transistors 715 and 716 is connected with a power supply line 722 to which the voltage VD is applied. The drain terminal of the transistor 717 is further connected with a gate terminal of the transistor 718. The drain terminal of the transistor 718 is further connected with a gate terminal of the transistor 717. The drain terminal of the transistor 716 is further connected with a gate terminal of the transistor 713 (node 723). The drain terminal of the transistor 715 is further connected with a gate terminal of the transistor 714 (node 724). A source terminal of each of the transistors 713 and 714 is connected with a power supply line 725 to which the voltage VL is applied. A drain terminal of the transistor 713 is connected with a drain terminal of the transistor 711. A drain terminal of the transistor 714 is connected with a drain terminal of the transistor 712. A source terminal of each of the transistors 711 and 712 is connected with a power supply line 726 to which the voltage VH is applied. The drain terminal of the transistor 711 is further connected with a gate terminal of the transistor 712. The drain terminal of the transistor 712 is further connected with a gate terminal of the transistor 711. The drain terminal of the transistor 714 is further connected with the output terminal O (again refer to FIG. 18).

In the level shifter circuit 683' shown in FIG. 21, the gate terminal of the transistor 715 (p-channel MOS transistor) receives an input signal from the input terminal N, and the gate terminal of the transistor 716 (p-channel MOS transistor) receives a signal obtained by logically inverting the input signal. The transistors 715 to 718 carry out conversion so that "H" of the input signal corresponds to a voltage of +3 V and "L" of the input signal corresponds to a voltage of −10 V. Thereafter, the transistors 711 to 714 carry out conversion so that "H" of the input signal corresponds to a voltage of +25 V and "L" of the input signal corresponds to a voltage of −10 V. Then, a signal thus converted is outputted from the output terminal O as an output signal (voltage signal) from the level shifter circuit 683'.

An object of the present invention is to further reduce the circuit scale and to thereby further reduce production costs of the gate driver 672, which is a premise of the present invention and is a scanning line drive device including: a shift register circuit 681 which includes latch circuits 6821 to 682n; and level shifter circuits 6831 to 683n which are constituted by n (n stages of) level shifter circuits 683 or n level shifter circuits 683'.

Embodiment 1

Figure 1:
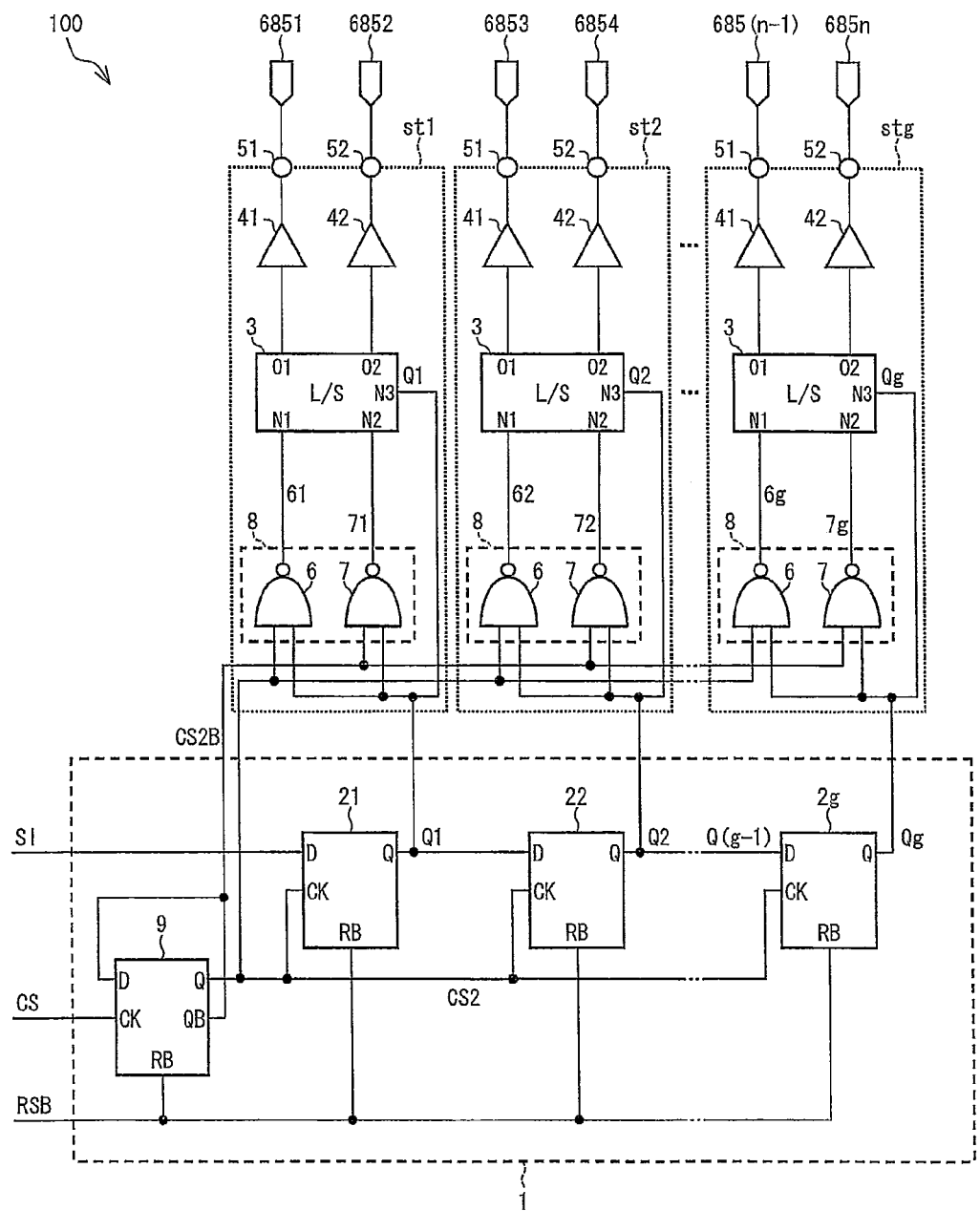
FIG. 1 is a view illustrating a circuit configuration of a scanning line drive device in accordance with an embodiment of the present invention.

FIG. 1 is a view illustrating a circuit configuration of a scanning line drive device in accordance with an embodiment of the present invention.

A gate driver (scanning line drive device) 100 shown in FIG. 1 is constituted by g output drive circuits st (st1 to stg) and a shift register circuit 1.

Each of the output drive circuits st includes a selection circuit (pulse generation circuit) 8, a level shifter circuit 3, buffer circuits 41 and 42, and output terminals 51 and 52. The shift register circuit 1 includes latch circuits (pulse generation circuits) 21 to 2g and a latch circuit 9. The selection circuit 8 includes NAND circuits 6 and 7. To the output terminals 51 and 52, output terminals 6851 to 685n, which are n output terminals of the gate driver 100, are connected. The output terminals 6851 to 685n are connected to respective scanning lines 677 (refer to FIG. 17) of a liquid crystal display panel 675. Note here that g is a natural number, and g=n/2 where n is the number of stages (n stages) shown in FIG. 18.

The shift register circuit 1 is constituted by the g latch circuits 2 (for convenience of description, the latch circuits 2 are additionally provided with respective reference numbers 1 to g in the same manner as in the latch circuits 682 shown in FIG. 18) and the latch circuit 9. Each of the latch circuits 2 and the latch circuit 9 is a usual D-FF circuit like the latch circuits 682 used in FIG. 18, and has a terminal D serving as an input terminal, a terminal Q serving as an output terminal, a terminal CK serving as a clock input terminal, a terminal RB serving as an input terminal for an inverted reset signal (logically inverted version of reset signal), and a terminal QB serving as an inversion output terminal from which a logically inverted version of a signal at the terminal Q is outputted. Note, however, that the terminal QB of each of the latch circuits 2 shown in FIG. 1 is not illustrated for convenience of description, because the terminal QB is not used here.

An inverted reset signal RSB is supplied to the terminal RB of each of the latch circuits 2 and the latch circuit 9. In each of the latch circuits 2 and the latch circuit 9, the signal to be outputted from the terminal Q is reset when the inverted reset signal RSB supplied to the terminal RB is a "L" signal.

An operating clock CS is supplied to the terminal CK of the latch circuit 9.

Upon receiving the operating clock CS, the latch circuit 9 generates a frequency-divided clock CS2 by dividing the frequency of the operating clock CS by two, and supplies the frequency-divided clock CS2 via its terminal Q to the terminal CK of each of the latch circuits 21 to 2g. Each of the latch circuits 21 to 2g operates in synchronization with the frequency-divided clock CS2 supplied to their terminal CK. The frequency-divided clock CS2 is supplied also to one of input terminals of the NAND circuit 6 of each selection circuit 8.

Further, upon receiving the operating clock CS, the latch circuit 9 generates an inverted frequency-divided clock CS2B by logically inverting the frequency-divided clock CS2, and supplies the inverted frequency-divided clock CS2B via its terminal QB to its terminal D and to one of input terminals of the NAND circuit 7 of each selection circuit 8.

A start signal SI is supplied to the terminal D of the latch circuit 21.

Upon receiving the start signal SI, the latch circuit generates a pulse (reference pulse) Q1 according to which two successive scanning lines connected with the respective output terminals 51 and 52 of the output drive circuit st1 are sequentially driven. Then, the latch circuit 21 supplies the pulse Q1 via its terminal Q to the other one of the input terminals of each of the NAND circuits 6 and 7 of the selection circuit 8 of the output drive circuit st1, to the level shifter circuit 3 of the output drive circuit st1, and to the terminal D of the latch circuit 22.

Subsequently, the latch circuit 22 generates, upon receiving the pulse Q1 at its terminal D, a pulse (reference pulse) Q2 according to which two scanning lines connected with the respective output terminals 51 and 52 of the output drive circuit st2 are sequentially driven. Then, the latch circuit 22 supplies the pulse Q2 via its terminal Q to the other one of the input terminals of each of the NAND circuits 6 and 7 of the selection circuit 8 of the output drive circuit st2, to the level shifter circuit 3 of the output drive circuit st2, and to the terminal D of the latch circuit 23 (not illustrated for convenience of description).

Lastly, the latch circuit 2g generates, upon receiving a pulse (reference pulse) Q(g−1) at its terminal D, a pulse (reference pulse) Qg according to which two scanning lines connected with the respective output terminals 51 and 52 of the output drive circuit stg are sequentially driven. Then, the latch circuit 2g supplies the pulse Qg via its terminal Q to the other one of the input terminals of each of the NAND circuits 6 and 7 of the selection circuit 8 of the output drive circuit stg, and to the level shifter circuit 3 of the output drive circuit stg.

The shift register circuit 1 is the one that sequentially shifts the reference pulses from the pulse Q1 to the pulse Qg in synchronization with the frequency-divided clock CS2, and sequentially supplies the pulses to the respective output drive circuits st1 to stg.

The NAND circuit 6 included in each selection circuit 8 supplies, to the level shifter circuit 3 directly connected thereto, a signal representing a logical NAND of the frequency-divided clock CS2 and a corresponding one of the pulses Q1 to Qg supplied to the NAND circuit 6. Further, the NAND circuit 7 included in each selection circuit 8 supplies, to the level shifter circuit 3 directly connected thereto, a signal representing a logical NAND of the inverted frequency-divided clock CS2B and a corresponding one of the pulses Q1 to Qg supplied to the NAND circuit 7. Note here that signals outputted from the NAND circuits 6 of the selection circuits 8 are referred to as a pulse 61 (output drive circuit st1), a pulse 62 (output drive circuit st2), . . . , and a pulse 6g (output drive circuit stg), respectively. Further, signals outputted from the NAND circuits 7 are referred to as a pulse 71 (output drive circuit st1), a pulse 72 (output drive circuit st2), . . . , and a pulse 7g (output drive circuit stg), respectively. Each of the pulses 61 to 6g is a first pulse in accordance with the present invention, and each of the pulses 71 to 7g is a second pulse in accordance with the present invention.

The level shifter circuit 3 receives (i) at its input terminal (first input terminal) N1, a first pulse (a corresponding one of the pulses 61 to 6g) from the NAND circuit 6 directly connected thereto and (ii) at its input terminal (second input terminal) N2, a second pulse (a corresponding one of the pulses 71 to 7g) from the NAND circuit 7 directly connected thereto. Further, as described earlier, the level shifter circuit 3 receives, at its input terminal (third input terminal) N3, a reference pulse (a corresponding one of the pulses Q1 to Qg) from the latch circuit 2 whose Q terminal is directly connected to the input terminal N3.

Each level shifter circuit 3 logically inverts the first and second pulses thus received, and carries out voltage conversion so that "H" signals obtained by the logical inversion each have a voltage (e.g., a predetermined voltage VH between +10 V and +25 V) that is enough for liquid crystal drive in a liquid crystal display device (refer to FIG. 17). In this way, the first and second pulses are subjected to level conversion (that is, the level shifter circuit 3 generates voltage signals in accordance with the pulses). The voltage signals thus obtained by the level conversion are outputted from an output terminal O1 (first output terminal) and an output terminal O2 (second output terminal), respectively.

The detailed configuration of the level shifter circuit 3 is described later.

A voltage signal outputted from the output terminal O1 of the level shifter circuit 3 passes through the buffer circuit 41 directly connected to the output terminal O1, and then is outputted from the output terminal 51. Further, a voltage signal outputted from the output terminal O2 of the level shifter circuit 3 passes through the buffer circuit 42 directly connected to the output terminal O2, and then is outputted from the output terminal 52. In this way, the gate driver 100 functions as a scanning line drive device which drives n scanning lines connected to the output terminals 6851 to 685n, respectively.

FIG. 2 is a timing chart illustrating how the gate driver 100 operates.

The start signal SI is a pulse signal indicative of a start of operation of the gate driver 100 (chart SI). The start signal SI is recognized by the latch circuit 21 (refer to FIG. 1) at a timing (time t1) at which the frequency-divided clock CS2 rises from "L" to "H" (chart CS2).

At the time t1, upon recognizing that the start signal SI is "H" at the timing of a rising edge of the operating clock CS, the latch circuit 21 causes the pulse Q1 to rise from "L" to "H" (chart Q1).

The pulse 61 outputted from the NAND circuit 6 of the selection circuit 8 of the output drive circuit st1 is kept at "H" while the pulse Q1 is "L". On the other hand, the pulse 61 is "L" while the pulse Q1 is "H" and the frequency-divided clock CS2 is "H", i.e., from the time t1 to time t2 (chart 61).

The pulse 71 outputted from the NAND circuit 7 of the selection circuit 8 of the output drive circuit st1 is kept at "H" while the pulse Q1 is "L". On the other hand, the pulse 71 is "L" while the pulse Q1 is "H" and the inverted frequency-divided clock CS2B (chart CS2B) is "H", i.e., from the time t2 to time t3 (chart 71).

The timings at which the pulses Q1 to Qg become "H" are shifted by operations of the shift register circuit 1 such that a timing at which a preceding pulse becomes "H" is earlier by one (1) period of the frequency-divided clock CS2 than a timing at which a subsequent pulse becomes "H". For example, in a case where the pulse Q1 from the latch circuit 21 is "H" during a period corresponding to a period from the time t1 to time t3, the pulse Q2 from the latch circuit 22 is "H" during a period corresponding to one (1) period of the frequency-divided clock CS2 starting from the time t3, i.e., from the time t3 to the time t5 (chart Q2).

The pulse 62 outputted from the NAND circuit 6 of the selection circuit 8 of the output drive circuit st2 is kept at "H" while the pulse Q2 is "L". On the other hand, the pulse 62 is "L" while the pulse Q2 is "H" and the frequency-divided clock CS2 is "H", i.e., from the time t3 to time t4 (chart 62).

The pulse 72 outputted from the NAND circuit 7 of the selection circuit 8 of the output drive circuit st2 is kept at "H" while the pulse Q2 is "L". On the other hand, the pulse 72 is "L" while the pulse Q2 is "H" and the inverted frequency-divided clock CS2B is "H", i.e., from the time t4 to time t5 (chart 72).

The level shifter circuit 3 of the output drive circuit st1 logically inverts the pulse 61 supplied thereto, and carries out voltage conversion so that a signal obtained by the logical inversion has a predetermined voltage VH, thereby generating a voltage signal. The voltage signal is outputted from the output terminal O1 of the level shifter circuit 3 of the output drive circuit st1, passes through the buffer circuit 41 of the output drive circuit st1, and then is outputted from the output terminal 51 of the output drive circuit (chart 51 (st1) OUTPUT).

The level shifter circuit 3 of the output drive circuit st1 further inverts logically the pulse 71 supplied thereto, and carries out voltage conversion so that a "H" signal obtained by the logical inversion has a predetermined voltage VH, thereby generating a voltage signal. The voltage signal is outputted from the output terminal O2 of the level shifter circuit 3 of the output drive circuit st1, passes through the buffer circuit 42 of the output drive circuit st1, and then is outputted from the output terminal 52 of the output drive circuit st1 (chart 52 (st1) OUTPUT).

The level shifter circuit 3 of the output drive circuit st2 logically inverts the pulse 62 supplied thereto, and carries out voltage conversion so that a "H" signal obtained by the logical inversion has a predetermined voltage VH, thereby generating a voltage signal. The voltage signal is outputted from the output terminal O1 of the level shifter circuit 3 of the output drive circuit st2, passes through the buffer circuit 41 of the output drive circuit st2, and then is outputted from the output terminal 51 of the output drive circuit st2 (chart 51 (st2) OUTPUT).

The level shifter circuit 3 of the output drive circuit st2 further inverts logically the pulse 72 supplied thereto, and carries out voltage conversion so that a "H" signal obtained by the logical inversion has a predetermined voltage VH, thereby generating a voltage signal. The voltage signal is outputted from the output terminal O2 of the level shifter circuit 3 of the output drive circuit st2, passes through the buffer circuit 42 of the output drive circuit st2, and then is outputted from the output terminal 52 of the output drive circuit st2 (chart 52 (st2) OUTPUT).

As has been described, the level shifter circuit 3 of each of the output drive circuits st1 to stg logically inverts the first pulse supplied thereto, and carries out voltage conversion so that a "H" signal obtained by the logical inversion has a predetermined voltage VH, thereby generating a voltage signal. The voltage signal is outputted from the output terminal O1 of the level shifter circuit 3, passes through the buffer circuit 41, and then is supplied to the output terminal 51. The level shifter circuit 3 of each of the output drive circuits st1 to stg further inverts logically the second pulse supplied thereto, and carries out voltage conversion so that a "H" signal obtained by the logical inversion has a predetermined voltage VH, thereby generating a voltage signal. The voltage signal is outputted from the output terminal O2 of the level shifter circuit 3, passes through the buffer circuit 42, and then is supplied to the output terminal 52.

Figure 3:
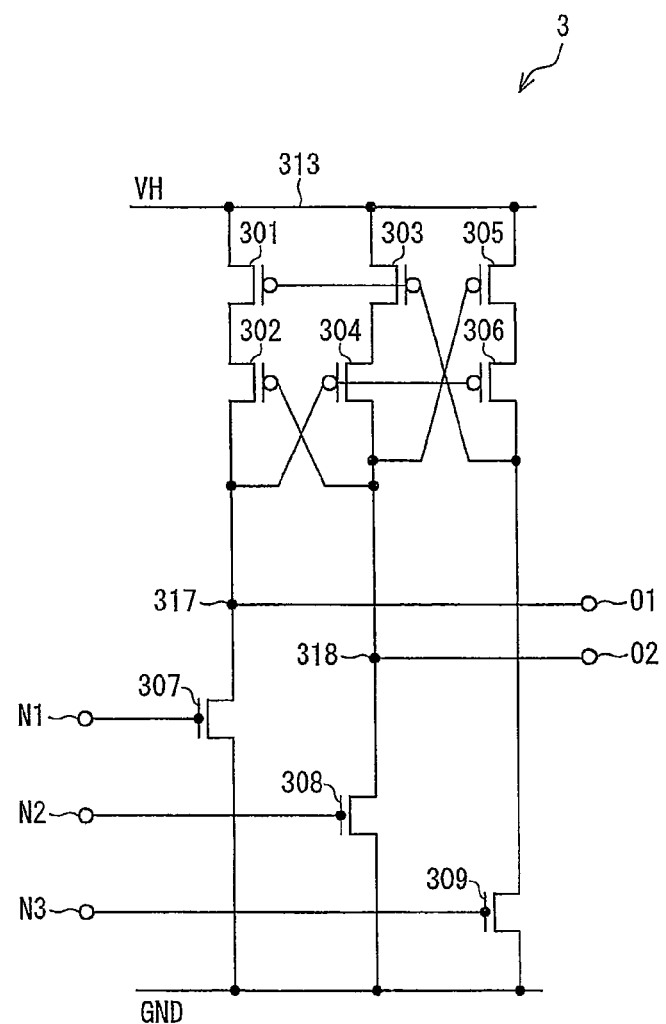
FIG. 3 is a view illustrating an example of a circuit configuration of a level shifter circuit in accordance with the present invention.

FIG. 3 illustrates an example of a circuit configuration of the level shifter circuit 3. Note that the voltage VH is greater than the voltage corresponding to "H" of each of the signals supplied to the input terminals N1, N2 and N3.

The level shifter circuit 3 shown in FIG. 3 is constituted by nine MOS transistors (first to ninth transistors) 301 to 309, each of which withstands voltages equal to and greater than VH. The transistors 301 to 306 are p-channel transistors, while the transistors 307 to 309 are n-channel transistors.

Further, the W/L of each of the transistors 301 to 306 is 5.0/4.8, and the W/L of each of the transistors 307 to 309 is 240.0/1.2.

The level shifter circuit 3 shown in FIG. 3 is configured as below.

The input terminal N1 is connected with a gate terminal of the transistor 307. The input terminal N2 is connected with a gate terminal of the transistor 308. The input terminal N3 is connected with a gate terminal of the transistor 309.

The transistor 301 has a gate terminal connected with a gate terminal of the transistor 303, a drain terminal connected with a source terminal of the transistor 302, and a source terminal connected with a power supply line (first power supply) 313 to which the voltage VH is applied.

The transistor 302 has a gate terminal connected with a drain terminal of the transistor 304, and a drain terminal connected with a drain terminal of the transistor 307.

The transistor 303 has the gate terminal connected with a drain terminal of the transistor 306, a drain terminal connected with a source terminal of the transistor 304, and a source terminal connected with the power supply line 313.

The transistor 304 has a gate terminal connected with the drain terminal of the transistor 302.

The transistor 305 has a gate terminal connected with the drain terminal of the transistor 304, a drain terminal connected with a source terminal of the transistor 306, and a source terminal connected with the power supply line 313.

The transistor 306 has a gate terminal connected with the gate terminal of the transistor 304, and the drain terminal connected with a drain terminal of the transistor 309.

The transistor 307 has a source terminal connected with a ground line (second power supply).

The transistor 308 has a source terminal connected with the ground line, and a drain terminal connected with the drain terminal of the transistor 304.

The transistor 309 has a source terminal connected with the ground line.

Further, the output terminal O1 is connected with a node 317 connecting the drain terminal of the transistor 302 and the drain terminal of the transistor 307. The output terminal O2 is connected with a node 318 connecting the drain terminal of the transistor 304 and the drain terminal of the transistor 308.

Figure 4:
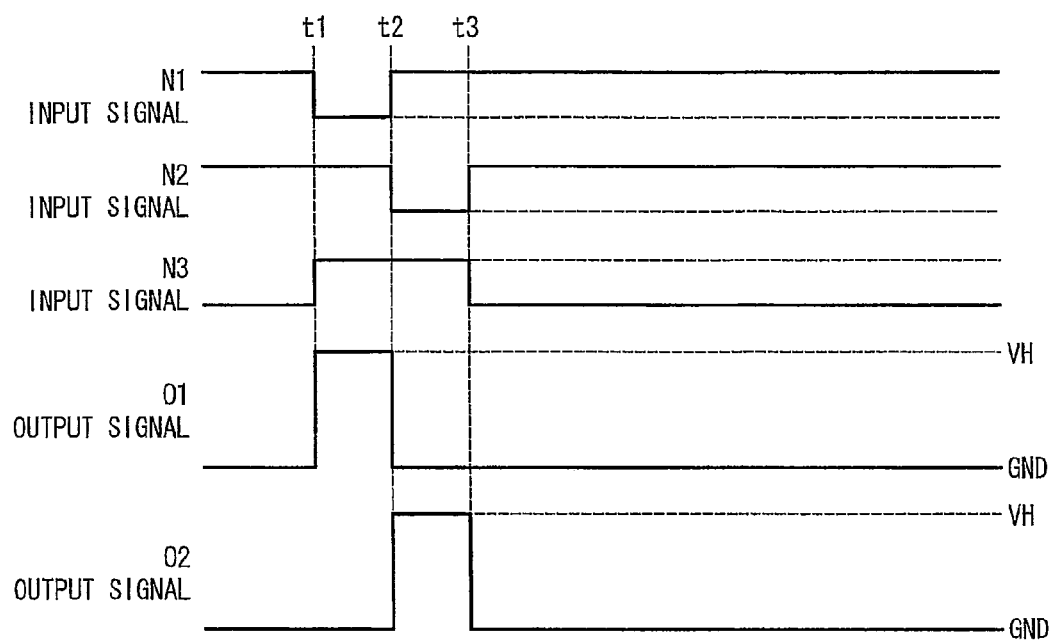
FIG. 4 is a timing chart illustrating how the level shifter circuit shown in FIG. 3 generates voltage signals.

FIG. 4 is a timing chart illustrating how the level shifter circuit 3 generates voltage signals. Note, here, that input signals received at the input terminals N1, N2 and N3 are the same as the signals supplied from time t1 to the time t3 shown in FIG. 2. An input signal received at the input terminal N1 corresponds to the pulse 61, an input signal received at the input terminal N2 corresponds to the pulse 71, and an input signal received at the input terminal N3 corresponds to the pulse Q1.

At and before the time t1, the input signal received at the input terminal N3 is "L", and the input signals received at the input terminals N1 and N2 are "H". In this case, in the level shifter circuit 3 shown in FIG. 3, the transistors 307 and 308 are conductive, whereas the transistor 309 is nonconductive. Since the transistors 307 and 308 are conductive, the voltage signals outputted from the output terminals O1 and O2 are both "L".

Further, at and before the time t1, since the transistors 307 and 308 are conductive, the transistors 302, 304, 305 and 306 are also conductive. Since the transistors 305 and 306 are conductive, the transistors 301 and 303 are nonconductive. Since the transistors 301, 303 and 309 are nonconductive, no through current flow between the power source line 313 and the ground line.

From the time t1 to the time t2, the input signal received at the input terminal N3 is "H", the input signal received at the input terminal N1 is "L", and the input signal received at the input terminal N2 is "H". In this case, in the level shifter circuit 3 shown in FIG. 3, the transistor 308 is still conductive. Therefore, the voltage signal outputted from the output terminal O2 keeps at "L". Further, since the transistor 308 is conductive, the transistors 302 and 305 are also conductive. Since the input signal received at the input terminal N3 is "H", the transistors 301, 303 and 309 are conductive. Since the input signal received at the input terminal N1 is "L", the transistor 307 is nonconductive. Note however that, since the transistors 301 and 302 are conductive as described above, the voltage signal outputted from the output terminal O1 is "H". Since the voltage signal outputted from the output terminal O1 is "H", the transistors 304 and 306 are nonconductive. Since the transistors 304, 306 and 307 are nonconductive, no through current flow.

From the time t2 to the time t3, the input signal received at the input terminal N3 is "H", the input signal received at the input terminal N1 is "H", and the input signal received at the input terminal N2 is "L". Since the input signal received at the input terminal N3 is "H", the transistors 301, 303 and 309 are conductive. Since the input signal received at the input terminal N1 is "H", the transistor 307 is conductive, the voltage signal outputted from the output terminal O1 is "L", and the transistors 304 and 306 are conductive. Since the input signal received at the input terminal N2 is "L", the transistor 308 is nonconductive. Note however that, since the transistors 303 and 304 are conductive, the voltage signal outputted from the output terminal O2 is "H". This makes the transistors 302 and 305 nonconductive. Since the transistors 302, 305 and 308 are nonconductive, no through current flow.

At and after the time t3, each of the input signals received at the respective input terminals N1, N2 and N3 are the same as those at and before the time t1. Therefore, the voltage signals outputted from the output terminals O1 and O2 are both "L".

Note that the function of the level shifter circuit 3 is restricted so as to operate only when the input signals received at the respective input terminals N1, N2 and N3 are in any of the above combinations. For example, in a case where the input signal received at the input terminal N3 is "L" and the input signal received at the input terminal N1 is "L", the voltage signal outputted from the output terminal O1 is in unstable condition.

That is, in the gate driver 100 of FIG. 1 including g latch circuits 2 and g selection circuits 8, where g is one half the number (n types) of the voltage signals necessary for driving n scanning lines, the pulses 61, 71 and Q1 to be supplied to the input terminals N1, N2 and N3 of the level shifter circuit 3 should be definitely in any of the above combinations.

The following description discusses how much the circuit scale of the gate driver 100 shown in FIG. 1 is reduced in comparison with the gate driver 672 shown in FIG. 18.

The gate driver 100 and the gate driver 672 are the same in that both of them are each capable of driving n scanning lines.

The number (g=2/n) of the latch circuits 2 constituting the shift register circuit 1 of the gate driver 100 is one half the number (n) of the latch circuits 682 constituting the shift register circuit 681 of the gate driver 672.

Note, here, that the shift register circuit 1 of the gate driver 100 additionally requires the latch circuit 9, which is for generating the frequency-divided clock CS2 and the inverted frequency-divided clock CS2B. Even taking this into consideration, it is possible to sufficiently reduce the number of the latch circuits constituting the shift register 1 provided that the number n of the scanning lines is large.

Meanwhile, the gate driver 100 is different from the gate driver 672 in that it further includes the selection circuits 8, i.e., g NAND circuits 6 and g NAND circuits 7. Note, however, that the number of transistors included in each of the selection circuits 8 thus further included is smaller than the number of transistors included in a latch circuit 682 (any one of latch circuits 6821 to 682n, the number of these latch circuits can be reduced) (details thereof are described later). Therefore, it is possible to reduce the number of transistors in the entire gate driver 100 as compared to the gate driver 672.

Moreover, when making an integrated circuit of each of these drivers, it is possible to reduce the circuit scale of the gate driver 100 as compared to the gate driver 672. This makes it possible to reduce the production costs of the gate driver 100 as compared to the gate driver 672.

As described earlier, according to the gate driver 100, it is possible to reduce the number of the latch circuits by approximately n/2, as compared to the gate driver 672. On the other hand, the gate driver 100 further includes n/2 selection circuits 8. The following description more specifically discusses how much the circuit scale of the gate driver 100 is reduced, by comparing the latch circuits with the selection circuits 8 in terms of their specific circuit configurations.

Figure 13:
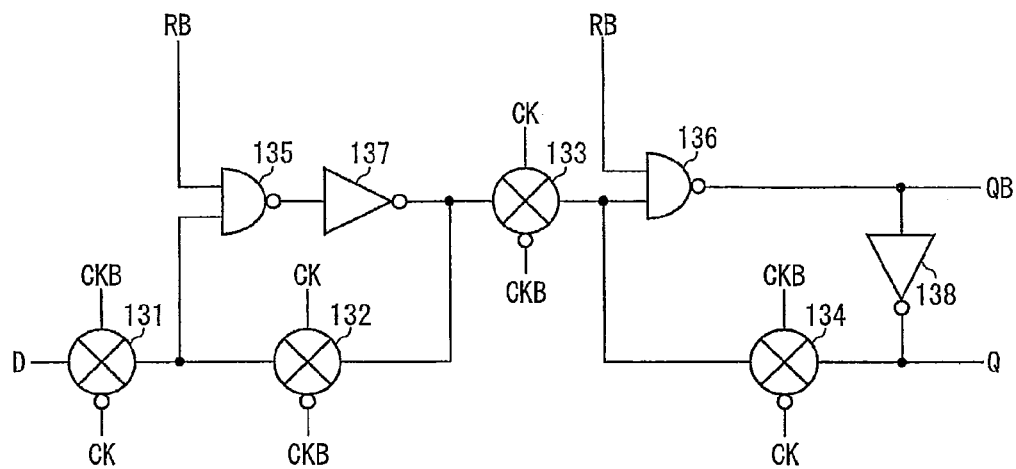
FIG. 13 is a view illustrating an example of a general circuit configuration of a latch circuit.
Figure 14:
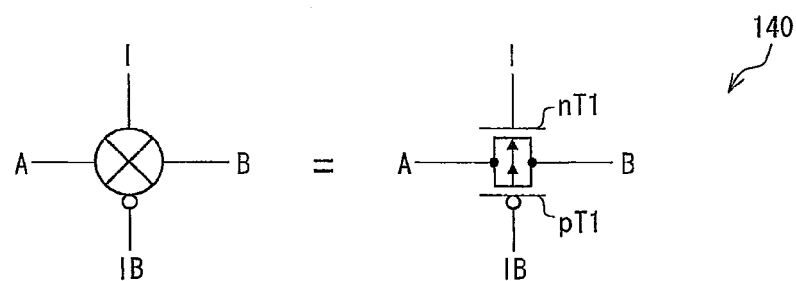
FIG. 14 is a view illustrating how an analog switch of the latch circuit is configured.
Figure 15:
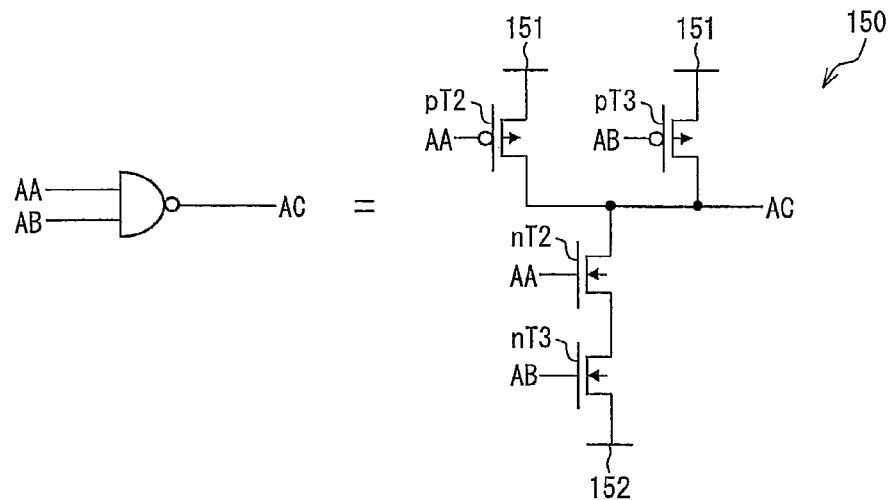
FIG. 15 is a view illustrating how a NAND circuit of the latch circuit is configured.
Figure 16:
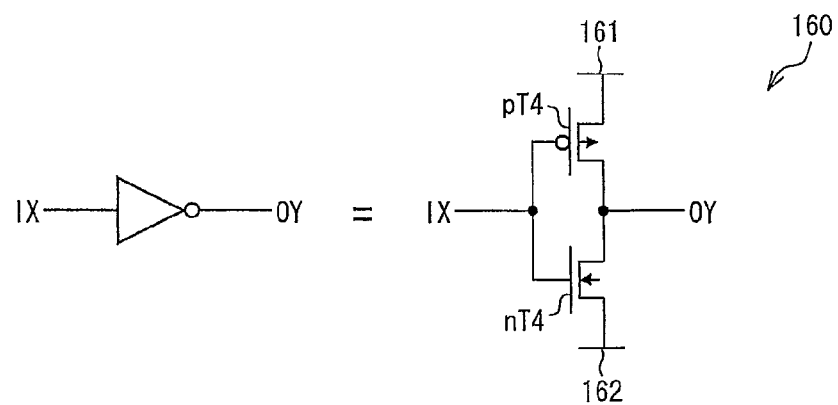
FIG. 16 is a view illustrating how an inverter of the latch circuit is configured.

FIG. 13 is a view illustrating an example of a general circuit configuration of each of the latch circuits. FIG. 14 is a view illustrating how an analog switch included in each of the latch circuits is configured. FIG. 15 is a view illustrating how a NAND circuit included in each of the latch circuits is configured. FIG. 16 is a view illustrating how an inverter included in each of the latch circuits is configured.

In FIGS. 1 and 18, the terminal CK of each of the latch circuits 2, 9 and 682, which terminal serves as an input terminal for the operating clock CS, is illustrated for convenience of explanation of each timing chart shown in FIG. 2. Note however that, a latch circuit shown in FIG. 13, which is for actual use as the latch circuits 2 and 9 shown in FIG. 1 or the latch circuits 682 shown FIG. 18, further receives an inverted operating clock CSB obtained by logically inverting the operating clock CS. FIG. 13 further illustrates an input terminal for the inverted operating clock of each of the latch circuits, which input terminal is a terminal CKB.

The latch circuit shown in FIG. 13 is constituted by four analog switches 131 to 134, two NAND circuits 135 and 136, and two inverters 137 and 138.

A terminal D is provided on the analog switch 131. A terminal CK and the terminal CKB are provided on each of the analog switches 131 to 134. A terminal Q is provided on the analog switch 134. A terminal QB is provided on an output terminal of the NAND circuit 136. A terminal RB is provided on one of input terminals of each of the NAND circuits 135 and 136.

The analog switch 131 is connected with the analog switch 132 and with the other one of the input terminals of the NAND circuit 135. An output terminal of the NAND circuit 135 is connected with an input terminal of the inverter 137. An output terminal of the inverter 137 is connected with the analog switches 132 and 133. The analog switch 133 is connected with the analog switch 134 and with the other one of the input terminals of the NAND circuit 136. Further, the terminal Q is connected with the terminal QB via the inverter 138.

FIG. 14 illustrates an analog switch 140 which shows the configuration of each of the analog switches 131 to 134. The analog switch 140 is constituted by a combination of an n-channel MOS transistor nT1 and a p-channel MOS transistor pT1.

FIG. 15 illustrates a NAND circuit 150 which shows the configuration of each of the NAND circuits 135 and 136. In the NAND circuit 150, a gate terminal of a p-channel MOS transistor pT2 and a gate terminal of the re-channel MOS transistor nT2 serve as one input terminal, a gate terminal of a p-channel MOS transistor pT3 and a gate terminal of an n-channel MOS transistors nT3 serve as the other input terminal, and a drain terminal of each of the p-channel MOS transistors pT2 and pT3 and re-channel MOS transistors nT2 and nT3 serves as an output terminal. The source terminal of each of the p-channel MOS transistors pT2 and pT3 is connected with a power supply line 151, and the drain terminal of each of the p-channel MOS transistors pT2 and pT3 is connected with a ground line 152 via the n-channel MOS transistors nT2 and nT3 in which a source terminal of one of these transistors is connected with a drain terminal of the other one of these transistors.

FIG. 16 illustrates an inverter 160 which shows the configuration of each of the inverters 137 and 138. In the inverter 160, a node connecting the gate terminals of a p-channel MOS transistor pT4 and a n-channel MOS transistor nT4 serves as an input terminal, and a node connecting drain terminals of the transistors pT4 and nT4 serves as an output terminal. A source terminal of the p-channel MOS transistor pT4 is connected with a power supply line 161, and a source terminal of the n-channel MOS transistor nT4 is connected with a ground line 162.

It is clear from FIGS. 13 to 16 that the number of transistors can be reduced more significantly when two NAND circuits are employed than when a latch circuit shown in FIG. 13 is employed.

Further, the circuit scale of the level shifter circuit 3 (refer to FIG. 3) of the gate driver 100 can be reduced as compared to the level shifter circuit 683 (refer to FIG. 20) of the gate driver 672.

Specifically, the following description discusses a comparison between the level shifter circuit 3 and the level shifter circuit 683. First, the level shifter circuit 3 has a function equivalent to two level shifter circuits 683. That is, the level shifter circuit 3 is capable of generating two different voltage signals.

The two level shifter circuits 683 require four p-channel MOS transistors (two transistors 701 and two transistors 702) and four n-channel MOS transistors (two transistors 703 and two transistors 704), each of which withstands voltages equal to and greater than the voltage VH.

On the other hand, one (1) level shifter circuit 3 requires six p-channel MOS transistors (transistors 301 to 306) and three n-channel MOS transistors (transistors 307 to 309), each of which withstands voltages equal to and greater than the voltage VH.

Note here that, in a level shifter circuit, it is not possible to switch between operation states unless on-resistance of n-channel MOS transistors is smaller than that of p-channel MOS transistors. Therefore, usually, in order to ensure quick and stable operations of the circuit, it is necessary to design the level shifter circuit such that the width of the gate terminal of each of the n-channel MOS transistors is large relative to the width of the gate terminal of each of the p-channel MOS transistors. Taking into this consideration, the gate terminal of each of the re-channel MOS transistors is designed to be large in width, and the gate terminal of each of the p-channel MOS transistors is designed to be large in length.

The transistors 703 and 704 (refer to FIG. 20) and the transistors 307 to 309 (refer to FIG. 3), which are n-channel MOS transistors, are each designed such that the gate terminal is 240.0 in width (W) and 1.2 in length (L).

The transistors 701 and 702 (refer to FIG. 20), which are p-channel MOS transistors, are each designed such that the gate terminal is 5.0 in width (W) and 9.6 in length (L). On the other hand, the transistors 301 to 306 (refer to FIG. 3), which are p-channel MOS transistors, are each designed such that the gate terminal is 5.0 in width (W) and 4.8 in length (L).

The length L of the gate terminal of each of the transistors 301 to 306 may be one half the length L of the gate terminal of each of the transistors 701 and 702, for the following reason. The reason is that, according to the level shifter circuit 3 (refer to FIG. 3), the drain terminal of the transistor 301 and the source terminal of the transistor 302 are connected with each other, the drain terminal of the transistor 303 and the source terminal of the transistor 304 are connected with each other, and the drain terminal of the transistor 305 and the source terminal of the transistor 306 are connected with each other, all of which transistors are p-channel MOS transistors. According to this configuration, the on-resistance of the transistors 301 and 302, the on-resistance of the transistors 303 and 304, and the on-resistance of the transistors 305 and 306 are each equivalent to the on-resistance of the transistor 701 or the on-resistance of the transistor 702.

The length L of the gate terminals of the six p-channel MOS transistors, i.e., the transistors 301 to 306, of the level shifter circuit 3 is substantially equal to the length L of the gate terminals of three p-channel MOS transistors of the level shifter circuit 683. In other words, the level shifter circuit 3 is smaller than the level shifter circuit 683 in terms of the total length L of the gate terminals of the p-channel MOS transistors.

As has been described, the level shifter circuit 3 can be designed such that (i) the number of the n-channel MOS transistors each of which is large in width is smaller as compared to the level shifter circuit 683 and (ii) the length L of the gate terminal of each of the p-channel MOS transistors is smaller as compared to the level shifter circuit 683. Accordingly, it is possible to reduce the total size of the p-channel MOS transistors of the level shifter circuit 3 as compared to the level shifter circuit 683.

As such, when making an integrated circuit, it is possible to reduce the circuit scale of the level shifter circuit 3 as compared to the level shifter circuit 683. This makes it possible to reduce the chip area, thereby reducing production costs.

Since the gate driver 100 shown in FIG. 1 includes a combination of the shift register circuit 1 and the selection circuit 8, each of which operates in accordance with the latch circuit 9 (frequency divider), the level shifter circuit 3 of the gate driver 100 is allowed to operate while satisfying any of the earlier-described combinations. That is, since the gate driver 100 shown in FIG. 1 includes the shift register circuit 1 and the level shifter circuit 3, it is possible to further reduce the circuit scale of the gate driver 100.

Embodiment 2

FIG. 5 is a view illustrating a circuit configuration of a scanning line driver device in accordance with another embodiment of the present invention.

A gate driver (scanning line drive device) 200 shown in FIG. 5 is different from the gate driver 100 shown in FIG. 1 in that it has the following circuit configuration.

The gate driver 200 shown in FIG. 5 includes a shift register circuit 210 instead of the shift register circuit 1, a selection circuit 28 instead of the selection circuit 8, and level shifter circuits 123 and 33 instead of the level shifter circuit 3. Each selection circuit 28 includes NOR circuits 26 and 27.

The shift register circuit 210 is the same as the shift register circuit 1 in that it includes the g latch circuits 2 (latch circuits 21 to 2g) and the latch circuit 9. Note, however, that the terminal QB of each of the latch circuits 21 to 2g shown in FIG. 5 is being used, and therefore is illustrated.

A frequency-divided clock CS2 outputted from the terminal Q of the latch circuit 9 is supplied to the terminal CK of each of the latch circuits 21 to 2g and to one of input terminals of the NOR circuit 27 of each selection circuit 28. An inverted frequency-divided clock CS2B outputted from the terminal QB of the latch circuit 9 is supplied to the terminal D of the latch circuit 9 itself and to one of input terminals of the NOR circuit 26 of each selection circuit 28.

The latch circuit 21 outputs, from the terminal Q, a pulse Q1 (in the present embodiment, this is not the reference pulse in accordance with the present invention) to supply it to the terminal D of the latch circuit 22. The latch circuit 21 further generates an inverted pulse (reference pulse) QB1 by logically inverting the pulse Q1, and supplies the pulse QB1 via the terminal QB to the other one of the input terminals of each of the NOR circuits 26 and 27 included in the selection circuit 28 of the output drive circuit st1 and to the level shifter circuit 123 of the output drive circuit st1. Upon receiving the pulse Q1 at the terminal D, the latch circuit 22 outputs, from the terminal Q, a pulse Q2 (in the present embodiment, this is not the reference pulse in accordance with the present invention) to supply it to the terminal D of the latch circuit 23 (not illustrated for convenience of description). The latch circuit 22 further generates an inverted pulse (reference pulse) QB2 by logically inverting the pulse Q2, and supplies the pulse QB2 via the terminal QB to the other one of the input terminals of each of the NOR circuits 26 and 27 included in the selection circuit 28 of the output drive circuit st2 and to the level shifter circuit 123 of the output drive circuit st2. Then, upon receiving a pulse Q(g−1) at the terminal D, the latch circuit 2g outputs, from the terminal Q, a pulse Qg (in the present embodiment, this is not the reference pulse in accordance with the present invention) to supply it to the terminal D of the latch circuit 2(g+1) (not illustrated for convenience of description). The latch circuit 2g further generates an inverted pulse (reference pulse) QBg by logically inverting the pulse Qg, and supplies the inverted pulse QBg via the terminal QB to the other one of the input terminals of each of the NOR circuits 26 and 27 included in the selection circuit 28 of the output drive circuit stg and to the level shifter circuit 123 of the output drive circuit stg.

The NOR circuit 26 of each selection circuit 28 supplies, to the level shifter circuit 123 directly connected thereto, a signal representing a logical NOR of the inverted frequency-divided clock CS2B and a corresponding one of the inverted pulses QB1 to QBg. The NOR circuit 27 of each selection circuit 28 supplies, to the level shifter circuit 123 directly connected thereto, a signal representing a logical NOR of the frequency-divided clock CS2 and a corresponding one of the inverted pulses QB1 to QBg. Note here that signals outputted from the NOR circuits 26 of the selection circuits 28 are referred to as a pulse 261 (output drive circuit st1), a pulse 262 (output drive circuit st2), . . . , and a pulse 26g (output drive circuit stg), respectively, and signals outputted from the NOR circuits 27 are referred to as a pulse 271 (output drive circuit st1), a pulse 272 (output drive circuit st2), . . . , and a pulse 27g (output drive circuit stg), respectively. Each of the pulses 261 to 26g is a first pulse in accordance with the present invention, and each of the pulses 271 to 27g is a second pulse in accordance with the present invention.

The level shifter circuit 123 receives (i) at its input terminal (first input terminal) N21, a first pulse (a corresponding one of the pulses 261 to 26g) from the NOR circuit 26 directly connected thereto and (ii) at its input terminal (second input terminal) N22, a second pulse (a corresponding one of the pulses 271 to 27g) from the NOR circuit 27 directly connected thereto. Further, as described earlier, the level shifter circuit 123 receives, at its input terminal (third input terminal) N23, a reference pulse (a corresponding one of the inverted pulses QB1 to QBg) from the latch circuit 2 whose QB terminal is directly connected to the input terminal N23.

The level shifter circuit 123 logically inverts the first and second pulses thus received, and carries out voltage conversion so that "L" signals obtained by the logical inversion each have a negative voltage (e.g., voltage VL which is −10 V), thereby generating first to third signals. The first signal is obtained from the first pulse, and is to be subjected to level conversion so as to be a voltage signal supplied to the output terminal 51 corresponding to the level shifter circuit 123. First signals are indicated by pf1 (output drive circuit st1), pf2 (output drive circuit st2), . . . , and pfg (output drive circuit stg). The second signal is obtained from the second pulse, and is to be subjected to level conversion so as to be a voltage signal supplied to the output terminal 52 corresponding to the level shifter circuit 123. Second signals are indicated by ps1 (output drive circuit st1), ps2 (output drive circuit st2), . . . , and psg (output drive circuit stg). The third signal is a signal for controlling various operations of the level shifter circuit 33, which is to be involved in each level conversion. Third signals are indicated by pt1 (output drive circuit st1), pt2 (output drive circuit st2), . . . , and ptg (output drive circuit ptg).

The level shifter circuit 33 logically inverts the first and second signals thus received, and carries out voltage conversion so that "H" signals obtained by the logical inversion each have a voltage (e.g., a predetermined voltage VH between +10 V and +25 V) that is enough for liquid crystal drive in a liquid crystal display device (refer to FIG. 17). In this way, the level shifter circuit 33 carries out the level conversion of the first and second signals that is, generates voltage signals in accordance with the pulses). The voltage signals thus obtained by level conversion are outputted from an output terminal O21 (first output terminal) and an output terminal O22 (second output terminal), respectively.

The detailed configurations of the level shifter circuits 123 and 33 are described later.

A voltage signal outputted from the output terminal O21 of the level shifter circuit 33 passes through the buffer circuit 41 directly connected to the output terminal O21, and then is outputted from the output terminal 51. Further, a voltage signal outputted from the output terminal O22 of the level shifter circuit 33 passes through the buffer circuit 42 directly connected to the output terminal O22, and then is outputted from the output terminal 52.

Figure 6:
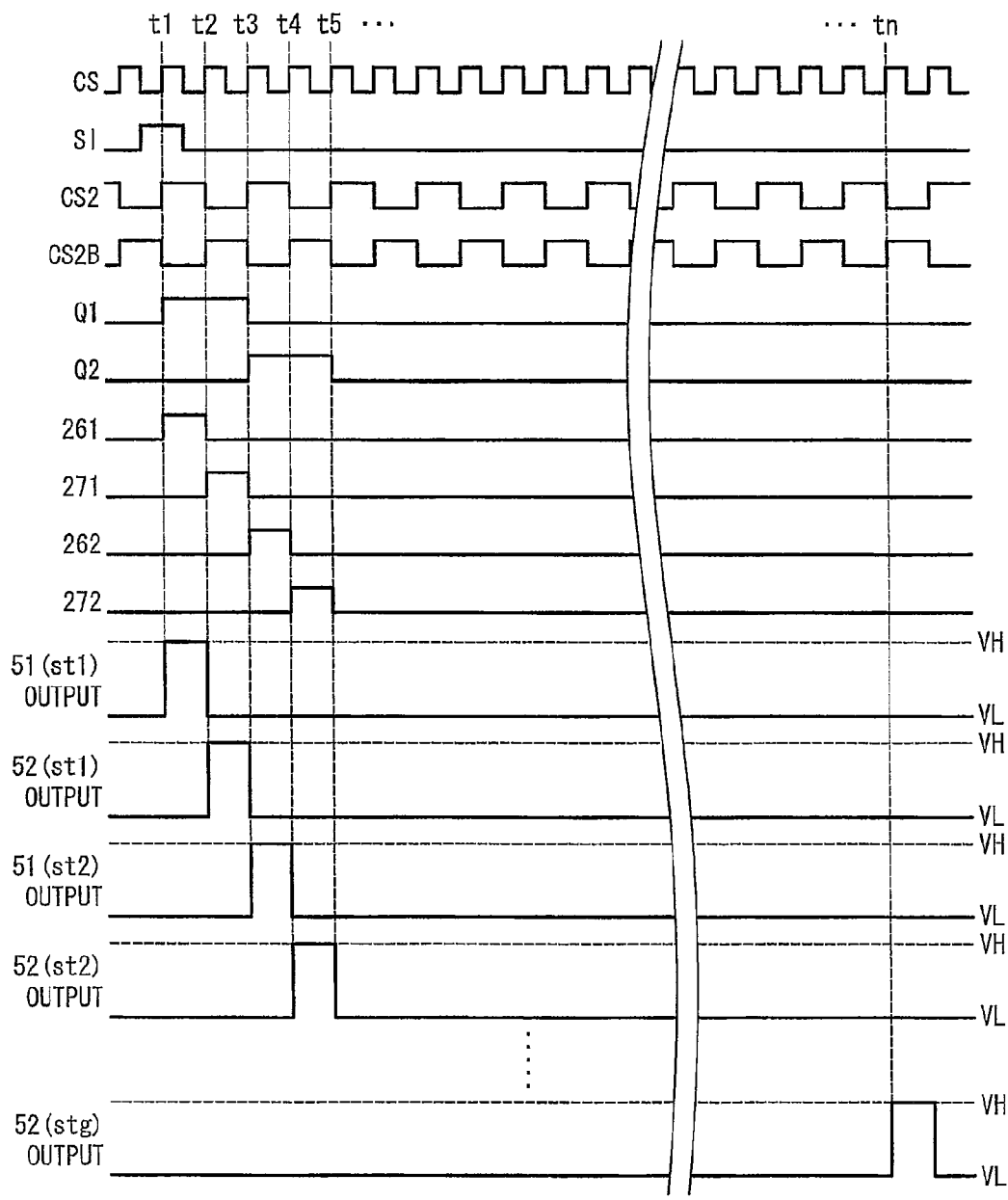
FIG. 6 is a timing chart illustrating how the scanning line drive device shown in FIG. 5 operates.

FIG. 6 is a timing chart illustrating how the gate driver 200 operates. Since the times t1 to tn, chart CS, chart SI, chart CS2, chart CS2B, chart Q1, and chart Q2 are the same as those illustrated in the timing chart of FIG. 2, detailed descriptions therefor are omitted here. Note, however, that the start signal SI is a pulse signal indicative of a start of operation of the gate driver 200.

The pulse 261 outputted from the NOR circuit 26 of the selection circuit 28 of the output drive circuit st1 is kept at "L" while the pulse Q1 is "L" (while the inverted pulse QB1 supplied to the NOR circuit 26 is "H"). On the other hand, the pulse 261 is "H" while the pulse Q1 is "H" (while the inverted pulse QB1 supplied to the NOR circuit 26 is "L") and the inverted frequency-divided clock CS2B is "L", i.e., from the time t1 to the time t2 (chart 261).

The pulse 271 outputted from the NOR circuit 27 of the selection circuit 28 of the output drive circuit st1 is kept at "L" while the pulse Q1 is "L" (while the inverted pulse QB1 supplied to the NOR circuit 27 is "H"). On the other hand, the pulse 271 is "H" while the pulse Q1 is "H" (while the inverted pulse QB1 supplied to the NOR circuit 27 is "L") and the frequency-divided clock CS2 is "L", i.e., from the time t2 to the time t3 (chart 271).

The pulse 262 outputted from the NOR circuit 26 of the selection circuit 28 of the output drive circuit st2 is kept at "L" while the pulse Q2 is "L" (while the inverted pulse QB2 supplied to the NOR circuit 26 is "H"). On the other hand, the pulse 262 is "H" while the pulse Q2 is "H" (while the inverted pulse QB2 supplied to the NOR circuit 26 is "L") and the inverted frequency-divided clock CS2B is "L", i.e., from the time t3 to the time t4 (chart 262).

The pulse 272 outputted from the NOR circuit 27 of the selection circuit 28 of the output drive circuit st2 is kept at "L" while the pulse Q2 is "L" (while the inverted pulse QB2 supplied to the NOR circuit 27 is "H"). On the other hand, the pulse 272 is "H" while the pulse Q2 is "H" (while the inverted pulse QB2 supplied to the NOR circuit 27 is "L") and the frequency-divided clock CS2 is "L", i.e., from the time t4 to the time t5 (chart 272).

The level shifter circuit 123 of the output drive circuit st1 logically inverts the pulse 261 supplied thereto, carries out voltage conversion to obtain the first signal pf1 composed of the voltage VL (corresponding to "L" of voltage signal to be obtained) and VD (corresponding to "H" of voltage signal to be obtained), and supplies the first signal pf1 to the level shifter circuit 33 of the output drive circuit st1. The level shifter circuit 33 of the output drive circuit st1 logically inverts the first signal pf1 supplied, and carries out voltage conversion so that a "H" signal obtained by the logical inversion has a predetermined voltage VH, thereby generating a voltage signal. The voltage signal is outputted from the output terminal O21 of the level shifter circuit 33 of the output drive circuit st1, passes through the buffer circuit 41 of the output drive circuit st1, and is outputted from the output terminal 51 of the output drive circuit st1 (chart 51 (st1) OUTPUT).

The level shifter circuit 123 of the output drive circuit st1 further inverts logically the pulse 271 supplied thereto, carries out voltage conversion to obtain the second signal ps1 composed of the voltage VL (corresponding to "L" of voltage signal to be obtained) and VD (corresponding to "H" of voltage signal to be obtained), and supplies the second signal ps1 to the level shifter circuit 33 of the output drive circuit st1. The level shifter circuit 33 of the output drive circuit st1 logically inverts the second signal ps1 supplied, and carries out voltage conversion so that a "H" signal obtained by the logical inversion has a predetermined voltage VH, thereby generating a voltage signal. The voltage signal is outputted from the output terminal O22 of the level shifter circuit 33 of the output drive circuit st1, passes through the buffer circuit 42 of the output drive circuit st1, and is outputted from the output terminal 52 of the output drive circuit st1 (chart 52 (st1) OUTPUT).

The level shifter circuit 123 of the output drive circuit st2 logically inverts the pulse 262 supplied thereto, carries out voltage conversion to obtain the first signal pf2 composed of the voltage VL (corresponding to "L" of voltage signal to be obtained) and VD (corresponding to "H" of voltage signal to be obtained), and supplies the first signal pf2 to the level shifter circuit 33 of the output drive circuit st2. The level shifter circuit 33 of the output drive circuit st2 logically inverts the first signal pf2 supplied, and carries out voltage conversion so that a "H" signal obtained by the logical inversion has a predetermined voltage VH, thereby generating a voltage signal. The voltage signal is outputted from the output terminal O21 of the level shifter circuit 33 of the output drive circuit st2, passes through the buffer circuit 41 of the output drive circuit st2, and is outputted from the output terminal 51 of the output drive circuit st2 (chart 51 (st2) OUTPUT).

The level shifter circuit 123 of the output drive circuit st2 further inverts logically the pulse 272 supplied thereto, carries out voltage conversion to obtain the second signal ps2 composed of the voltage VL (corresponding to "L" of voltage signal to be obtained) and VD (corresponding to "H" of voltage signal to be obtained), and then supplies the second signal ps2 to the level shifter circuit 33 of the output drive circuit st2. The level shifter circuit 33 of the output drive circuit st2 logically inverts the second signal ps2 supplied, and carries out voltage conversion so that a "H" signal obtained by the logical inversion has a predetermined voltage VH, thereby generating a voltage signal. The voltage signal is outputted from the output terminal O22 of the level shifter circuit 33 of the output drive circuit st2, passes through the buffer circuit 42 of the output drive circuit st2, and is outputted from the output terminal 52 of the output drive circuit st2 (chart 52 (st2) OUTPUT).

As has been described, the level shifter circuit 123 of each of the output drive circuits st1 to stg logically inverts the first pulse supplied thereto, carries out voltage conversion to obtain the first signal composed of the voltage VL (corresponding to "L" of voltage signal to be obtained) and the voltage VD (corresponding "H" of voltage signal to be obtained), and supplies the first signal to the level shifter circuit 33 directly connected thereto. The level shifter circuit 123 of each of the output drive circuits st1 to stg further inverts logically the second pulse supplied thereto, carries out voltage conversion to obtain the second signal composed of the voltage VL (corresponding to "L" of voltage signal to be obtained) and the voltage VD (corresponding to "H" of voltage signal to be obtained), and supplies the second signal to the level shifter circuit 33 directly connected thereto.

The level shifter circuit 33 logically inverts the first signal supplied, and carries out voltage conversion so that a "H" signal obtained by the logical inversion has a predetermined voltage VH, thereby generating a voltage signal. The voltage signal is outputted from the output terminal O21, passes through the buffer circuit 41, and is outputted from the output terminal 51. The level shifter circuit 33 further inverts logically the second signal supplied, and carries out voltage conversion so that a "H" signal obtained by the logical inversion has a predetermined voltage VH, thereby generating a voltage signal. The voltage signal is outputted from the output terminal O22, passes through the buffer circuit 42, and is outputted from the output terminal 52.

FIG. 7 illustrates an example of a circuit configuration of a level shifter circuit 3', which is a combination of the level shifter circuit 123 and the level shifter circuit 33.

In the level shifter circuit 3' shown in FIG. 7, the level shifter circuit 33 has the same circuit configuration as the level shifter circuit 3 (refer to FIG. 3) except that the source terminal of each of the transistors 307 to 309 is connected not to the ground line but to a power supply line (second power supply) 319 to which a voltage VL is applied. Therefore, detailed descriptions of the circuit configuration of the level shifter circuit 33 are omitted here. Each of the transistors 301 to 309 of the level shifter circuit 33 shown in FIG. 7 withstands voltages equal to and greater than (VH+|VL|). Note that, the voltage VL is lower than the voltage corresponding to "L" of each of signals supplied to the input terminals N21, N22 and N23, and is a negative voltage.

In the level shifter circuit 3' shown in FIG. 7, the level shifter circuit 123 is constituted by nine MOS transistors (first to ninth transistors) 321 to 329, each of which withstands voltages equal to and greater than (VD+|VL|). The transistors 321 to 326 are n-channel transistors, and the transistors 327 to 329 are p-channel transistors. Further, the W/L of each of the transistors 321 to 326 is 5.0/4.8, and the W/L of each of the transistors 327 to 329 is 480.0/1.2.

The level shifter circuit 123 shown in FIG. 7 is configured as below.

The input terminal N21 is connected with a gate terminal of the transistor 327. The input terminal N22 is connected with a gate terminal of the transistor 328. The input terminal N23 is connected a gate terminal of the transistor 329.

The transistor 321 has a gate terminal connected with a gate terminal of the transistor 323, a drain terminal connected with a source terminal of the transistor 322, and a source terminal connected with the power supply line 319.

The transistor 322 has a gate terminal connected with a drain terminal of the transistor 324, and a drain terminal connected with a drain terminal of the transistor 327.

The transistor 323 has the gate terminal connected with a drain terminal of the transistor 326, a drain terminal connected with a source terminal of the transistor 324, and a source terminal connected with the power supply line 319.

The transistor 324 has a gate terminal connected with the drain terminal of the transistor 322.

The transistor 325 has a gate terminal connected with the drain terminal of the transistor 324, a drain terminal connected with a source terminal of the transistor 326, and a source terminal connected with the power supply line 319.

The transistor 326 has a gate terminal connected with the gate terminal of the transistor 324, and the drain terminal connected with a drain terminal of the transistor 329.

The transistor 327 has a source terminal connected with a power supply line 333 to which the voltage VD is applied.

The transistor 328 has a drain terminal connected with the drain terminal of the transistor 324, and a source terminal connected with the power supply line 333.

The transistor 329 has a source terminal connected with the power supply line 333.

Further, a node 334 connecting the drain terminal of the transistor 322 and the drain terminal of the transistor 327 is connected with the input terminal N1 of the level shifter circuit 33, a node 335 connecting the drain terminal of the transistor 324 and the drain terminal of the transistor 328 is connected with the input terminal N2 of the level shifter circuit 33, and a node 336 connecting the drain terminal of the transistor 326 and the drain terminal of the transistor 329 is connected with the input terminal N3 of the level shifter circuit 33. Note here that the output terminal O21 of the level shifter circuit 33 corresponds to the output terminal O1 (refer to FIG. 3) of the level shifter circuit 3, and the output terminal O22 of the level shifter circuit 33 corresponds to the output terminal O2 (refer to FIG. 3) of the level shifter circuit 3.

Figure 8:
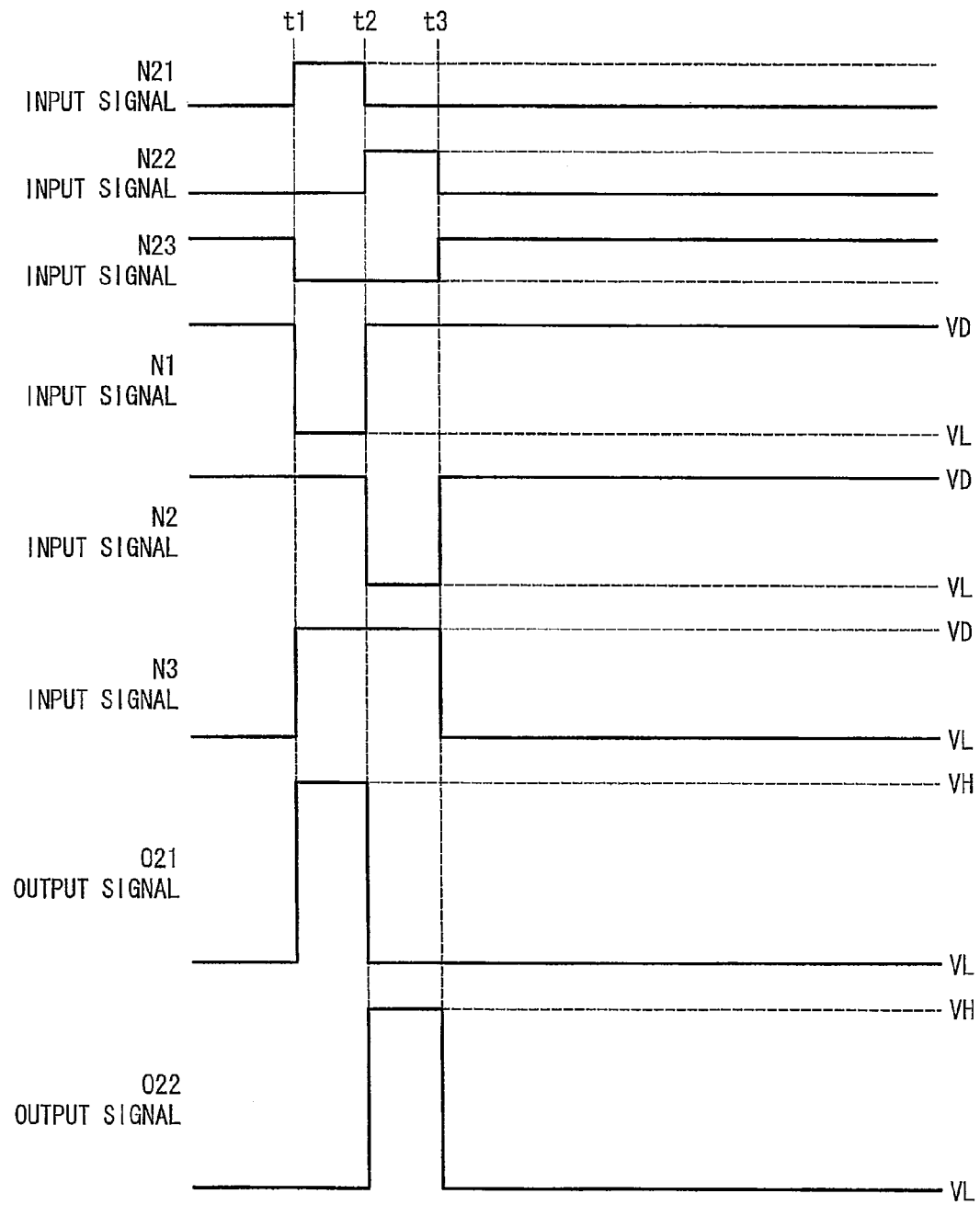
FIG. 8 is a timing chart illustrating how the level shifter circuit shown in FIG. 7 generates voltage signals.

FIG. 8 is a timing chart illustrating how the level shifter circuit 3' generates voltage signals. Note, here, that input signals received at the input terminals N21, N22 and N23 are the same as the signals supplied from the time t1 to the time t3 shown in FIG. 6. An input signal received at the input terminal N21 corresponds to the pulse 261, input signal received at the input terminal N22 corresponds to the pulse 271, and input signal received at the input terminal N23 corresponds to the inverted pulse QB1. An input signal received at the input terminal N1 corresponds to the first signal pf1, input signal received at the input terminal N2 corresponds to the second signal ps1, and input signal received at the input terminal N3 corresponds to the third signal pt1.

At and before the time t1, the input signal received at the input terminal N23 is "H", and the input signals received at the input terminals N21 and N22 are "L". In this case, in the level shifter circuit 123 shown in FIG. 7, the transistor 329 is conductive, whereas the transistors 327 and 328 are nonconductive. Since the transistor 329 is conductive, the signal (third signal) pt1 supplied via the node 336 to the input terminal N3 is "L". On the other hand, since the transistors 327 and 328 are nonconductive, the signal (first signal) pf1 supplied via the node 334 to the input terminal N1 and the signal (second signal) ps1 supplied via the node 335 to the input terminal N2 are both "H". This applies also to at and after the time t3.

From the time t1 to the time t2, the input signal received at the input terminal N23 is "L", the input signal received at the input terminal N21 is "H", and the input signal received at the input terminal N22 is "L". In this case, in the level shifter circuit 123 shown in FIG. 7, the transistor 327 is conductive, whereas the transistors 328 and 329 are nonconductive. Since the transistor 327 is conductive, the signal pf1 is "L". On the other hand, since the transistors 328 and 329 are nonconductive, the signals ps2 and pt1 are both "H".

From the time t2 to the time t3, the input signal received at the input terminal N23 is "L", the input signal received at the input terminal N21 is "L", and the input signal received at the input terminal N22 is "H". In this case, in the level shifter circuit 123 shown in FIG. 7, the transistor 328 is conductive, whereas the transistors 327 and 329 are nonconductive. Since the transistor 328 is conductive, the signal ps1 is "L". On the other hand, since the transistors 327 and 329 are nonconductive, the signal pf1 and pt1 are both "H".

Note, here, that "H" of each of the signals pf1, ps1 and pt1 corresponds to the voltage VD, and "L" of each of these signals corresponds to the voltage VL.

The signals pf1, ps1 and pt1 are supplied to the input terminals N1 to N3 of the level shifter circuit 33, respectively. The signals pf1, ps1 and pt1 are different in voltage levels corresponding to "H" and "L" from the signals received at the input terminals N1 to N3 shown in FIG. 4. Note, however, that the signals pf1, ps1 and pt1 are the same in waveforms as the signals received at the input terminals N1 to N3 shown in FIG. 4. Further, the level shifter circuit 33 which operates according to the signals pf1, ps1 and pt1 has, as described earlier, the same circuit configuration as the level shifter circuit 3 (refer to FIG. 3), except that the source terminal of each of the transistors 307 to 309 is connected not to the ground line but to the power supply line 319 to which the voltage VL is applied. Therefore, it is self-evident that the voltage signals having the waveforms shown in the chart O21 output signal and in the chart O22 output signal are outputted from the output terminals O21 (O1) and O22 (O2) of the level shifter circuit 33, respectively. This is easy for a person skilled in the art to understand by referring to the timing chart shown in FIG. 4.

Each of the signals pf1, ps1 and pt1 has a waveform obtained by logically inverting a waveform of a corresponding one of the signals supplied to the input terminals N21 to N23 of the level shifter circuit 123. Therefore, it can be considered that the timings of pulse generations are the same as those for the signals received at the input terminals N21 to N23 of the level shifter circuit 123. That is, the level shifter circuit 3 (refer to FIG. 3) and the level shifter circuit 33 are the same in that the transistor 307 switches between conductive and nonconductive states in accordance with whether or not the first pulse is generated, the transistor 308 switches between conductive and nonconductive states in accordance with whether or not the second pulse is generated, and the transistor 309 switches between conductive and nonconductive states in accordance with whether or not the third pulse is generated.

The circuit scale of the level shifter circuit 3' (refer to FIG. 7) can be reduced as compared to the level shifter circuit 683' (refer to FIG. 21).

That is, the level shifter circuit 3' requires nine p-channel MOS transistors (transistors 301 to 306, and 327 to 329) and nine n-channel MOS transistors (transistors 307 to 309, and 321 to 326).

On the other hand, the level shifter circuit 683' requires four p-channel MOS transistors (transistors 713, 714, 717 and 718) and four n-channel MOS transistors (transistors 711, 712, 715 and 716). Note, however, that the level shifter circuit 3' has a function equivalent to two level shifter circuits 683', i.e., a function of generating two different voltage signals. Therefore, in a case where the number of scanning lines to be driven is the same between the level shifter circuit 683' and the level shifter circuit 3', twice as many level shifter circuits 683' as the level shifter circuit(s) 3' are required. That is, in order for the level shifter circuit 683' to achieve a function equivalent to that of one (1) level shifter circuit 3', the level shifter circuit 683' needs eight p-channel MOS transistors and eight n-channel MOS transistors. In terms of only the number of transistors, the level shifter circuit 683' requires less transistors than the level shifter circuit 3' does to achieve the same functions.

However, taking the sizes of transistors into consideration, the level shifter circuit 3' is constituted by twelve transistors (transistors 301 to 306, and 321 to 326) each of which has the W/L of 5.0/4.8, three transistors (transistors 307 to 309) each of which has the W/L of 240.0/1.2, and three transistors (transistors 327 to 329) each of which has the W/L of 480.0/1.2. The area of the gate terminals of these transistors (i.e., product of the widths of the gate terminals times the lengths of the gate terminals) is 2880 µm². On the other hand, the level shifter circuit 683' is constituted by eight transistors (two transistors 711, two transistors 712, two transistors 717 and two transistors 718) each of which has the W/L of 5.0/9.6, four transistors (two transistors 713 and two transistors 714) each of which has the W/L of 240.0/1.2, and four transistors (two transistors 715 and two transistors 716) each of which has the W/L of 480.0/1.2. The area of the gate terminals of these transistors is 3840 µm².

Accordingly, the circuit scale of the level shifter circuit 3' can be reduced as compared to the level shifter circuit 683'.

Note that, since the specific configuration of the shift register circuit 210 is substantially the same as that of the shift register circuit 1 (refer to FIG. 1), descriptions of how much the circuit scale of the shift register circuit 210 is reduced are omitted here.

As has been described, when making an integrated circuit, it is possible to reduce the circuit scale of the level shifter circuit 3' as compared with the level shifter circuit 683'. This makes it possible to reduce the chip area, thereby reducing production costs.

Since the gate driver 200 shown in FIG. 5 includes a combination of the shift register circuit 210 and the selection circuit 28, each of which operates in accordance with the latch circuit 9 (frequency divider), the level shifter circuits 123 and 33 of the gate driver 200 are allowed to operate as described above. That is, since the gate driver 200 shown in FIG. 5 includes the shift register circuit 210 and the level shifter circuit 3', it is possible to further reduce the circuit scale.

Embodiment 3

Figure 9:
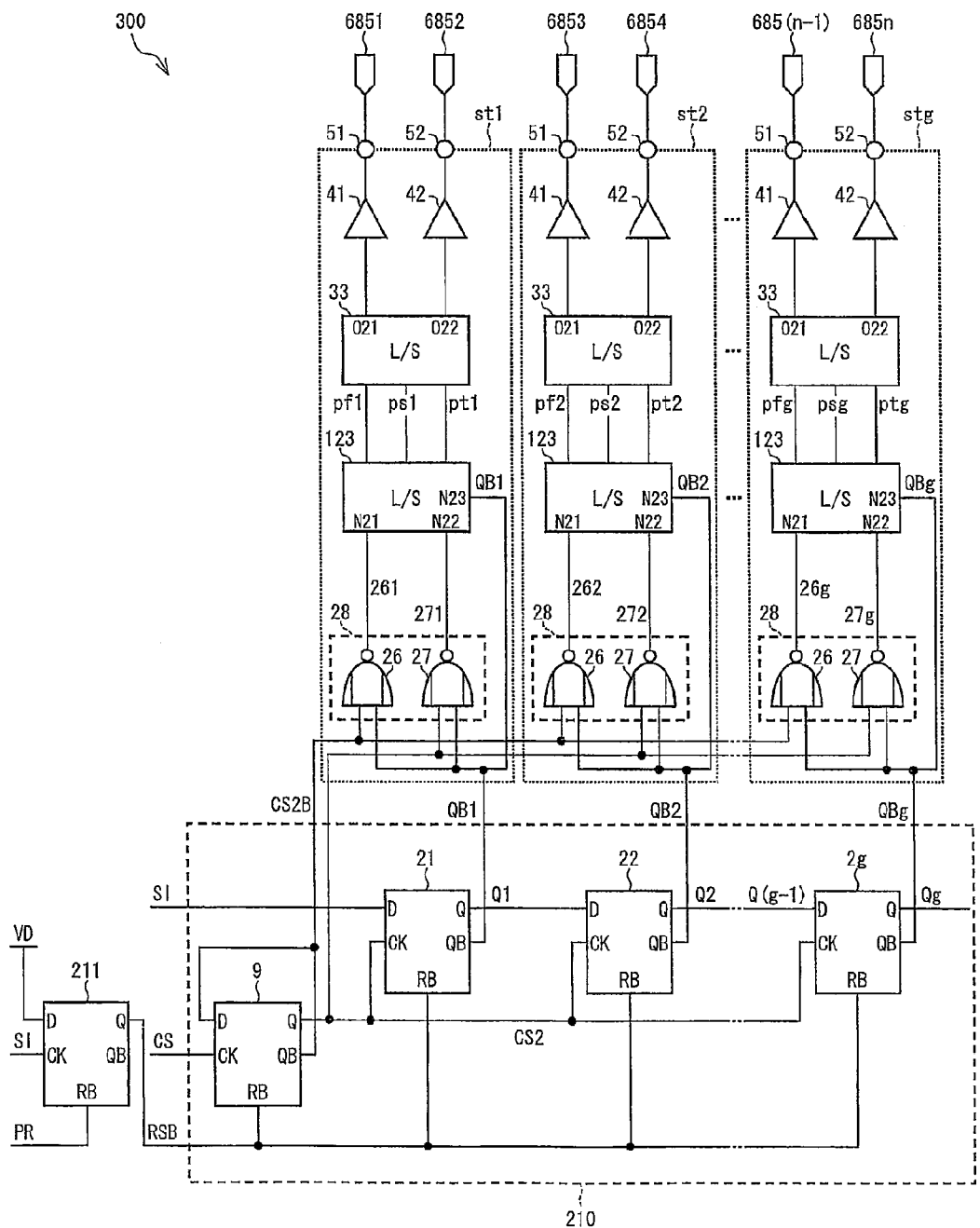
FIG. 9 is a view illustrating a circuit configuration of a scanning line drive device in accordance with a further embodiment of the present invention.

FIG. 9 is a view illustrating a circuit configuration of a scanning line drive device in accordance with a further embodiment of the present invention. A gate driver (scanning line drive device) 300 shown in FIG. 9 can be considered as a modification of the gate driver 200 shown in FIG. 5.

The gate driver 300 is the same as the gate driver 200 except that it further includes a latch circuit 211.

The latch circuit 211 has the same terminals as those of the latch circuits 21 to 2g and the latch circuit 9 (note however that the terminal QB can be omitted). The latch circuit 211 receives (i) at the terminal D, a voltage VD which is an operating voltage for the shift register circuit 210 and the latch circuit 211, (ii) at the terminal CK, a start signal SI, and (iii) at the terminal RB, a power-on reset signal PR. The latch circuit 211 outputs an inverted reset signal RSB from the terminal Q. The inverted reset signal RSB outputted from the terminal Q of the latch circuit 211 is supplied to the RB terminal of each of the latch circuits 21 to 2g and the latch circuit 9 of the shift register circuit 210.

The latch circuit 211 is provided for the purpose of synchronizing the start signal SI with the frequency-divided clock CS2.

When the gate driver 300 is started, the latch circuit 211 is reset by the power-on reset signal PR. The power-on reset signal PR may be the one generated by a circuit in the gate driver 300, such as a power-on reset circuit (not illustrated), or may be the one supplied from outside the gate driver 3. For example, the first reset after the start of the gate driver 300 is carried out by the power-on reset signal PR. After the start signal SI is supplied to the gate driver 300 and the reset of the gate driver 300 is released, the gate driver 300 is again reset for example in such a manner that (i) a new reset signal is generated upon detection of operation of the latch circuit (not illustrated) in the last stage of the shift register circuit 210 and (ii) a reset is carried out with use of the new reset signal thus generated.

Accordingly, in the gate driver 300, the latch circuit 9 stops operating and the entire register circuit 210 stops operating until a next start signal SI is supplied thereto. This can achieve low power consumption. Note here that, while the latch circuit 9 and the shift register circuit 210 are not operating, these circuits are waiting for a next start signal SI under this condition (i.e., the condition where latch circuit 9 is not operating and the entire shift register circuit 210 is not operating). Therefore, the shift register circuit 210 can resume its operation in response to input of the next start signal SI.

Figure 10:
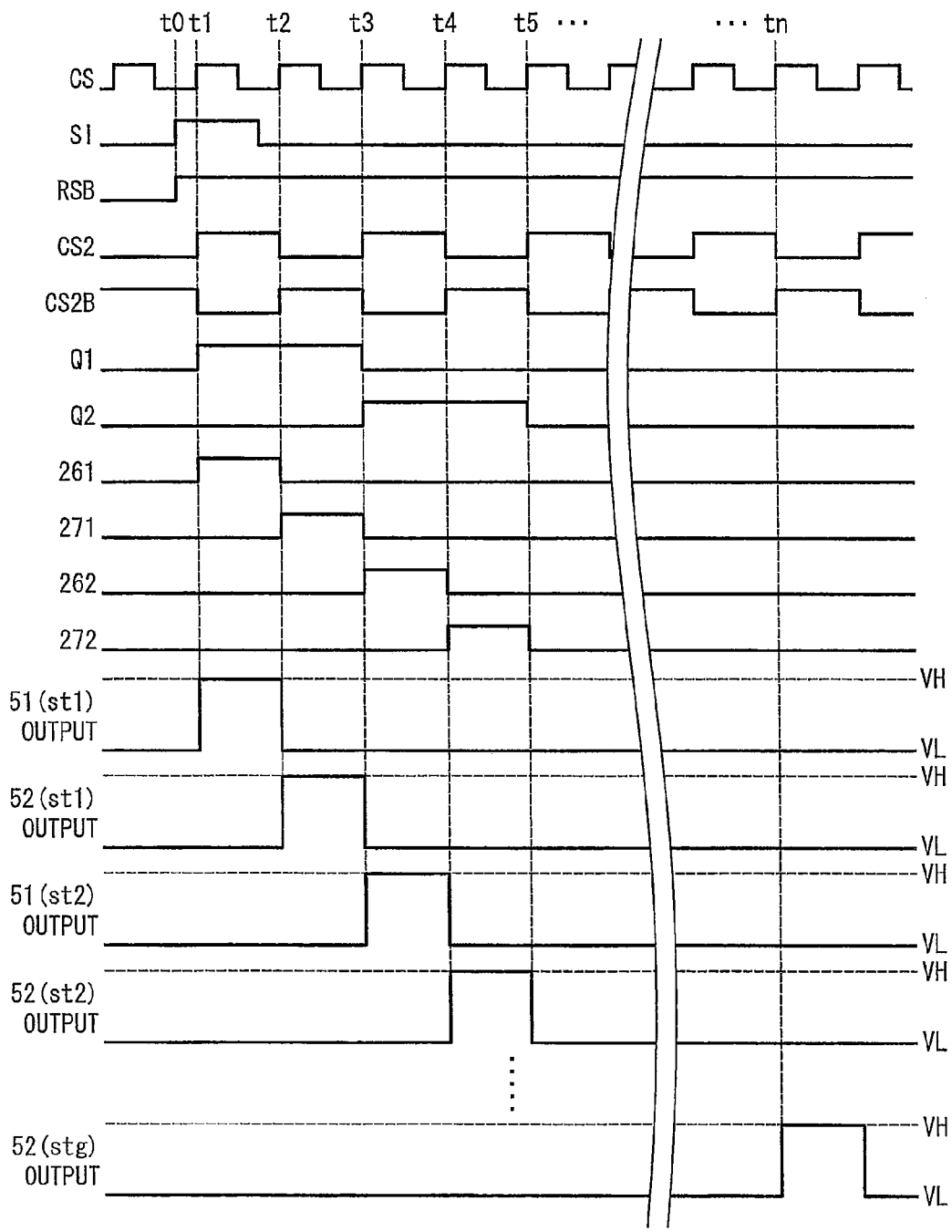
FIG. 10 is a timing chart illustrating how the scanning line drive device shown in FIG. 9 operates.

FIG. 10 is a timing chart illustrating how the gate driver 300 operates.

Each of the latch circuits 21 to 2g and the latch circuit 9 receives the inverted reset signal RSB (chart RSB) from the latch circuit 211. The latch circuits 21 to 2g and the latch circuit 9 are reset in a period during which the inverted reset signal RSB is "L", and the frequency-divided clock CS2 is kept at "L" during this period (chart CS2).

At the time t0 which is determined based on a rising edge of the operating clock CS by taking a setup period into consideration, the start signal SI (chart SI) is supplied to the latch circuits 211 and 21. In response to this, the inverted reset signal RSB becomes "H" at the timing at which the start signal SI rises. This causes the reset of the latch circuits 21 to 2g and the latch circuit 9 to be released.

Thereafter, when the frequency-divided clock CS2 rises at the time t1, the latch circuit 21 recognizes the rising of the start signal SI and generates a pulse Q1 in the same manner as in the gate driver 200 shown in FIG. 5 (chart Q1). Since subsequent processes are the same as those in the timing chart shown in FIG. 6, detailed descriptions therefor are omitted here.

As illustrated in FIG. 9, since the gate driver 300 further includes the latch circuit 211 for controlling the timings at which reset signals are outputted, it is possible to synchronize the start signal SI with the frequency-divided clock CS2 with a simple configuration. According to the configuration, it is possible to determine the timings at which the start signal SI is supplied to the latch circuit 21, in accordance with the timings of rising edges of the operating clock CS. This makes it unnecessary to cause the timings of the start signal SI to match the timings of rising edges of the frequency-divided clock CS2, which serves as the operating clock for the shifter register circuit 210. That is, this makes it possible to supply the start signal SI to the latch circuit 21 at the same timings as in a well-known shift register circuit, i.e., at the timings of rising edges of the operating clock CS.

The shift register circuit 210 recognizes a period during which the start signal SI is "H", at a point in time where the frequency-divided clock CS2 rises (refer to the charts SI and CS2 of FIG. 6). The timings at which the start signal SI is supplied to the shift register circuit 210 can be controlled more easily when determined in accordance with the timings of rising edges of the operating clock CS than when determined in accordance with the timings of rising edges of the frequency-divided clock CS2.

Example 4

Figure 11:
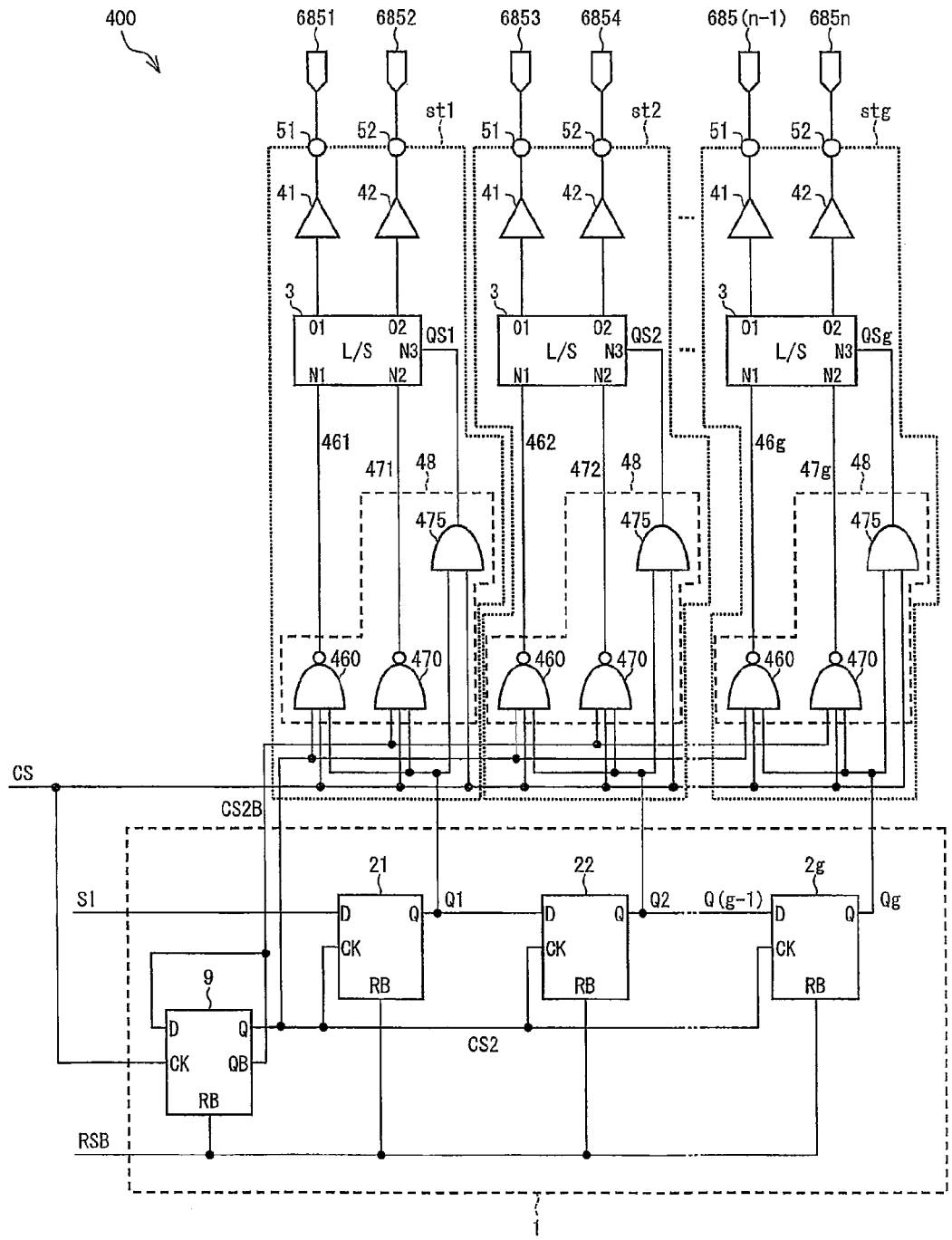
FIG. 11 is a view illustrating a circuit configuration of a scanning line drive device in accordance with still a further embodiment of the present invention.

FIG. 11 is a view illustrating a circuit configuration of a scanning line drive device in accordance with still a further embodiment of the present invention. A gate driver (scanning line drive device) 400 shown in FIG. 11 can be considered as a modification of the gate driver 100 shown in FIG. 1.

The gate driver 400 has the same configuration as the gate driver 100 except that it includes selection circuits 48 instead of the selection circuits 8. Each of the selection circuits 48 includes NAND circuits 460 and 470 and an AND circuit 475.

The NAND circuits 460 and 470 have the same configurations as the NAND circuits 6 and 7 of the gate driver 100 except that each of them has an additional input terminal. Each of the NAND circuits 460 and 470 receives the operating clock CS at this additional input terminal. The NAND circuit 460 supplies, to the level shifter circuit 3 directly connected thereto, a signal representing a logical NAND of the operating clock CS, the frequency-divided clock CS2 and a corresponding one of supplied pulses Q1 to Qg. The NAND circuit 470 supplies, to the level shifter circuit 3 directly connected thereto, a signal representing a logical NAND of the operating clock CS, the inverted frequency-divided clock CS2B and a corresponding one of supplied pulses Q1 to Qg. Note here that signals outputted from the NAND circuits 460 of the selection circuits 48 are referred to as a pulse 461 (output drive circuit st1), a pulse 462 (output drive circuit st2), . . . , and a pulse 46g (output drive circuit stg), respectively. Further, signals outputted from the NAND circuits 470 are referred to as a pulse 471 (output drive circuit st1), a pulse 472 (output drive circuit st2), . . . , and a pulse 47g (output drive circuit stg), respectively. Each of the pulses 461 to 46g is a first pulse in accordance with the present invention, and each of the pulses 471 to 47g is a second pulse in accordance with the present invention.

The AND circuit 475 receives, at one of its input terminals, a reference pulse (a corresponding one of the pulses Q1 to Qg) from the latch circuit 2 directly connected thereto, and receives the operating clock CS at the other one of its input terminals. The AND circuit 475 supplies, to the level shifter circuit 3 directly connected thereto, a signal (indicated by the reference numbers QS1 to QSg) representing a logical AND of the reference pulse and operating clock CS thus received, which signal serves as a third pulse.

According to the gate drivers 100, 200 and 300, the pulse width of each of the first and second pulses is equivalent to one half the frequency of the frequency-divided clock CS2. Note however that, according to the gate driver 400, the pulse width of each of the first and second pulses is not necessarily equivalent to one half the frequency of the frequency-divided clock CS2.

Figure 12:
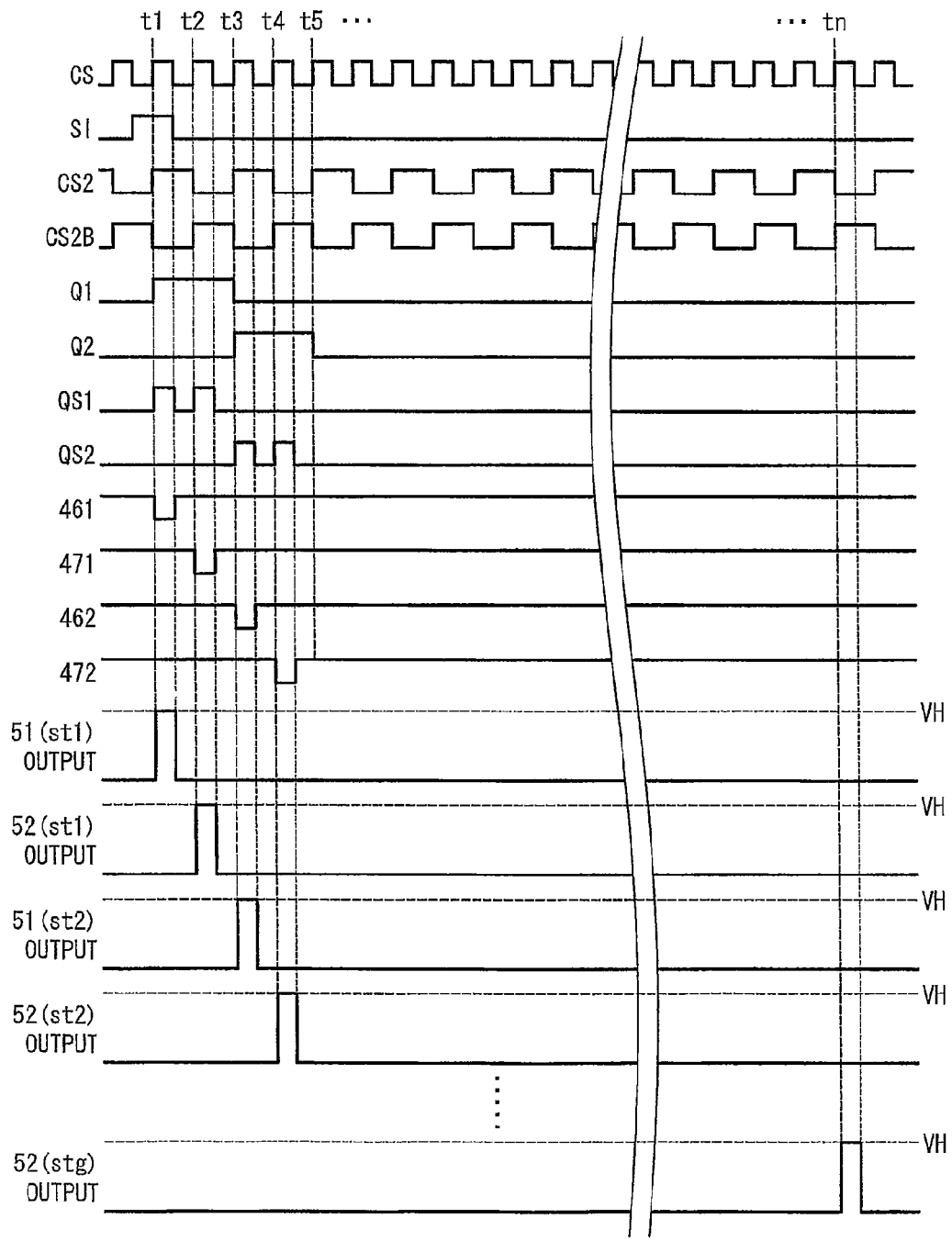
FIG. 12 is a timing chart illustrating how the scanning line drive device shown in FIG. 11 operates.

FIG. 12 is a timing chart illustrating how the gate driver 400 operates.

The pulses 461 and 462 and the pulses 471 and 472 correspond to the pulses 61 and 62 and the pulses 71 and 72 shown in FIG. 2, respectively. Note, however, that each of the pulses 461, 462, 471 and 472 is "L" only in the period during which the operating clock CS is "H" (charts 461, 471, 462 and 472). Similarly, the signals QS1 and QS2 from the AND circuits 475 correspond to the pulses Q1 and Q2 shown in FIG. 2, respectively. Note, however, that each of the signals QS1 and QS2 is "H" only in the period during which the operating clock CS is "H" (charts QS1 and QS2).

Subsequently, signals that are generated by the level shifter circuit 3 (refer to FIG. 11) of the output drive circuit st1 from the pulses 461 and 471 and the signal QS1 in the same manner as in FIGS. 3 and 4 are subjected to level conversion to be voltage signals, and the voltage signals are outputted from the output terminals 51 and 52 (chart 51 (st1) OUTPUT and chart 52 (st1) OUTPUT). Similarly, the voltage signals generated from the pulses 462 and 472 are subjected to level conversion and then outputted from the output terminals 51 and 52 (chart 51 (st2) OUTPUT and chart 52 (st2) OUTPUT). Lastly, during the period that starts from the time tn and lasts for one half the frequency of the operating clock CS, a voltage signal is outputted from the output terminal 52 of the output drive circuit stg (chart 52 (stg) OUTPUT).

Note here that, although the gate driver 400 uses the operating clock CS to determine the pulse width of each of the first and second pulses, how to determine the pulse width is not limited to the above. The pulse width of each of the first and second pulses can be adjusted as appropriate by using a signal having any pulse width. This allows the gate driver 400 to adjust as appropriate the scan period for each scanning line.

Embodiment 5

FIG. 23 is a view illustrating a circuit configuration of a level shifter circuit in accordance with an embodiment of the present invention.

A level shifter circuit 900 shown in FIG. 23 has the same configuration as the level shifter circuit 3 shown in FIG. 3 except that it includes inverters 903 and 904 and an NAND circuit 905 in a stage prior to the input terminals N1 to N3.

An input terminal N101 of the level shifter circuit 900 is connected with an input terminal of the inverter 903. An input terminal N102 of the level shifter circuit 900 is connected with an input terminal of the inverter 904. Output terminals of the inverters 903 and 904 are connected with respective input terminals of a NAND circuit 905. Output terminals O101 and O102 of the level shifter circuit 900 correspond to the respective output terminals O1 and O2 (refer to FIG. 3) of the level shifter circuit 3.

Further, an output terminal of the inverter 903 is connected with the input terminal N1, an output terminal of the inverter 904 is connected with the input terminal N2, and an output terminal of the NAND circuit 905 is connected with the input terminal N3.

The input terminals N101 and N102 receive pulses, which are logic signals. At least one of the pulses supplied to the respective input terminals N101 and N102 is "L". Examples of such pulses are the pulses outputted from respective two latch circuits (e.g., latch circuit 6821 and latch circuit 6822) directly connected with each other in a shift register circuit 981 (refer to FIG. 27). Since the input terminal N101 is connected with one (preceding stage) of two latch circuits directly connected with each other and the input terminal N102 is connected with the other one (subsequent stage) of the two latch circuits, it is possible to supply, to the input terminals N101 and N102, the above pulses at least one of which is "L". Note however that, needless to say, the above pulses are not limited to the pulses outputted from the two respective latch circuits directly connected with each other in the shift register circuit 981.

Figure 24:
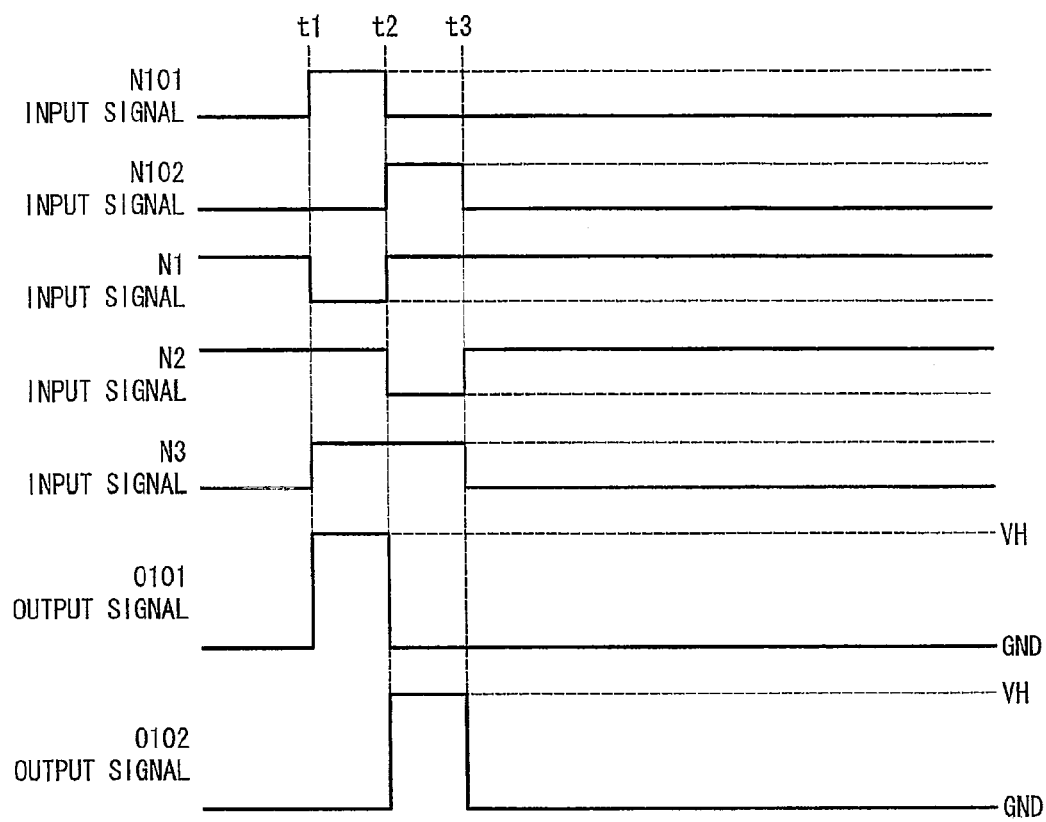
FIG. 24 is a timing chart illustrating how the level shifter circuit shown in FIG. 23 generates voltage signals.

FIG. 24 is a timing chart illustrating how the level shifter circuit 900 generates voltage signals.

A pulse supplied to the input terminal N101 is "L" at and before the time t1, is "H" from the time t1 to the time t2, and is "L" at and after the time t2 (chart N101 INPUT SIGNAL). A pulse supplied to the input terminal N102 is "L" at and before the time t2, is "H" from the time t2 to the time t3, and is "L" at and after the time t3 (chart N102 INPUT SIGNAL). As described above, at least one of the pulses supplied to the input terminals N101 and N102 is "L".

The pulse received at the input terminal N101 is logically inverted by the inverter 903, and is supplied, as a pulse 906, to the input terminal N1 (chart N1 input signal) and to one of the input terminals of the NAND circuit 905. The pulse received at the input terminal N102 is logically inverted by the inverter 904, and is supplied, as a pulse 907, to the input terminal N2 (chart N2 input signal) and to the other one of the input terminals of the NAND circuit 905.

The NAND circuit 905 generates and outputs a pulse 908, which is a signal representing a logical NAND of the pulses 906 and 907. The pulse 908 is supplied to the input terminal N3 (chart N3 INPUT SIGNAL).

The signals supplied to the input terminals N1 to N3 correspond to the respective pulses 906, 907 and 908. The pulses 906, 907 and 908 have the same waveforms as the respective pulses 61, 71 and Q1 (refer to FIG. 4). Further, the circuit, in the stage subsequent to the input terminals N1 to N3 of the level shifter circuit 900, which operates in accordance with supplied pulses 906, 907 and 908 has the same circuit configuration as the level shifter circuit 3 (refer to FIG. 3). Therefore, it is self-evident from the timing chart shown in FIG. 4 that a voltage signal having the waveform shown in the chart O101 OUTPUT SIGNAL is obtained at the output terminal O101 of the level shifter circuit 900 and a voltage signal having the waveform shown in the chart O102 OUTPUT SIGNAL is obtained at the output terminal O102 of the level shifter circuit 900. This should be easy for a person skilled in the art to understand.

According to the above configuration, like the level shifter circuit 3 shown in FIG. 3, when making an integrated circuit, it is possible to reduce the circuit scale of the level shifter circuit 900 as compared to the level shifter circuit 683 (refer to FIG. 20). This makes it possible to reduce the chip area, thereby reducing production costs.

Note that the level shifter circuit 900 further includes the NAND circuit 905. In this regard, a well-known logic circuit such as the NAND circuit 905 or a NOR circuit 913 (described later, refer to FIG. 25) has so small a circuit scale relative to the transistors 301 to 309 which withstand voltages equal to and greater than (VH+|VL|) that the size of such a circuit is ignorable.

Further, the level shifter circuit 900 shown in FIG. 23 includes the inverters 903 and 904. The inverters 903 and 904 are provided for the purpose of preventing the voltage signals outputted from the output terminals O101 and O102 from being logically inverted relative to the pulses supplied to the input terminals N101 and N102. In other words, the inverters 903 and 904 are provided for the purpose of preventing the voltage signals outputted from the output terminals O102 and O102 from being the inverted versions of the respective pulses supplied to the input terminals N101 and N102. Therefore, the inverters 903 and 904 are not essential provided that the pulses supplied to the input terminals N101 and N102 are each logically inverted beforehand.

Figure 25:
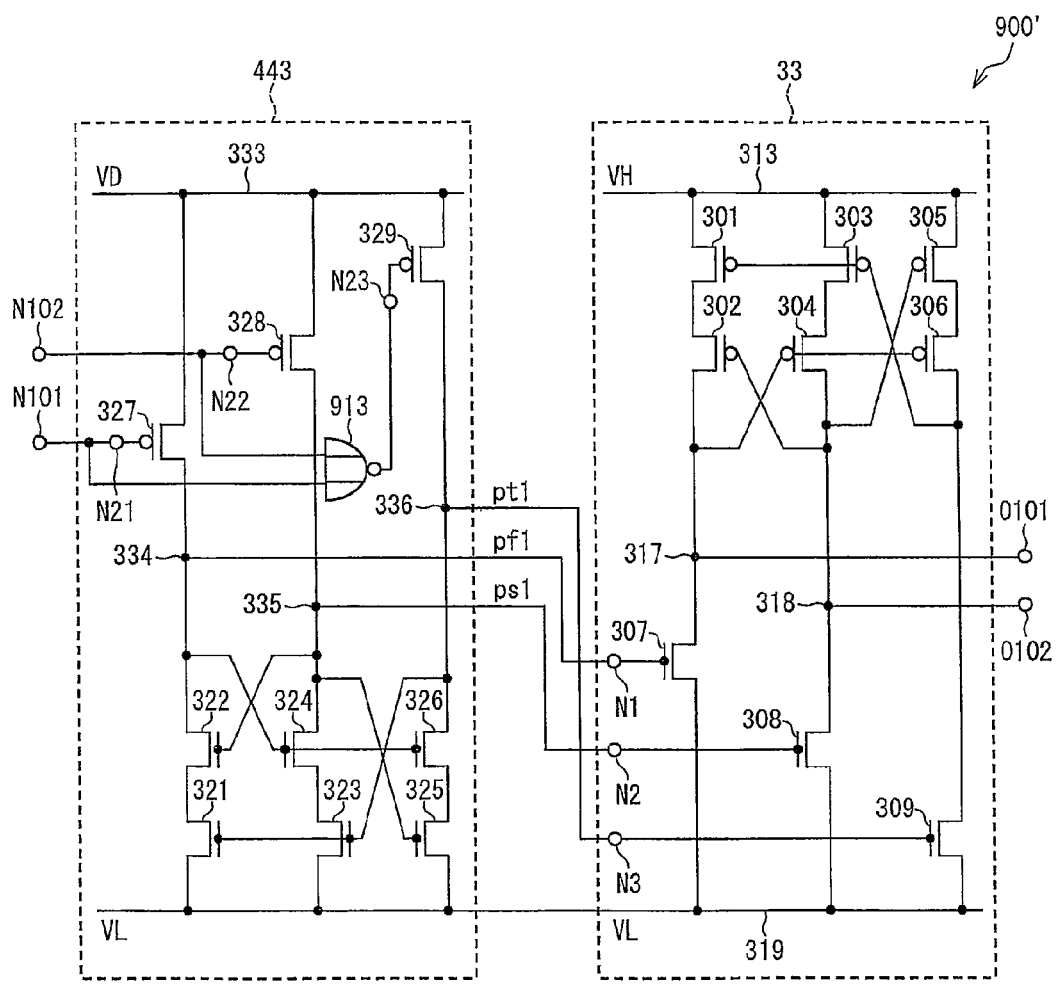
FIG. 25 is a view illustrating a circuit configuration of a level shifter circuit in accordance with another embodiment of the present invention.

FIG. 25 is a view illustrating a circuit configuration of a level shifter circuit in accordance with another embodiment of the present invention.

A level shifter circuit 900' shown in FIG. 25 has the same configuration as the level shifter circuit 3' shown in FIG. 7 except that it includes the NOR circuit 913 in a stage prior to the input terminals N21 to N23 (attention should be drawn to a level shifter circuit 443).

An input terminal N101 of the level shifter circuit 900' is connected with one of input terminals of the NOR circuit 913. An input terminal N102 of the level shifter circuit 900' is connected with the other one of the input terminals of the NOR circuit 913. The output terminals O101 and O102 of the level shifter circuit 900' correspond to the respective output terminals O21 and O22 (refer to FIG. 7) of the level shifter circuit 3'.

Further, the input terminal N101 is connected with an input terminal N21, the input terminal N102 is connected with an input terminal N22, and the output terminal of the NOR circuit 913 is connected with an input terminal N23.

The input terminals N101 and N102 receive pulses, which are logic signals. At least one of the pulses supplied to the respective input terminals N101 and N102 is "L". Examples of such pulses are the pulses outputted from respective two latch circuits (e.g., latch circuit 6821 and latch circuit 6822) directly connected with each other in the shift register circuit 981 (refer to FIG. 27). Since the input terminal N101 is connected with one (preceding stage) of the two latch circuits directly connected with each other and the input terminal N102 is connected with the other one (subsequent stage) of the two latch circuits, it is possible to supply, to the respective input terminals N101 and N102, the above pulses at least one of which is "L". Note however that, needless to say, the above pulses are not limited to the pulses outputted from the two respective latch circuits directly connected with each other in the shift register circuit 981.

FIG. 26 is a timing chart illustrating how the level shifter circuit 900' generates voltage signals.

A pulse supplied to the input terminal N101 is "L" at and before the time t1, is "H" from the time t1 to the time t2, and is "L" at and after the time t2 (chart N101 (N21) INPUT SIGNAL). A pulse supplied to the input terminal N102 is "L" at and before the time t2, is "H" from the time t2 to the time t3, and is "L" at and after the time t3 (chart N102 (N22) INPUT SIGNAL). As described above, at least one of the pulses supplied to the respective input terminals N101 and N102 is "L".

The NOR circuit 913 generates and outputs a signal representing a logical NOR of the pulse received at the input terminal N101 and the pulse received at the input terminal N102 (chart N23 output signal).

The signals supplied to the respective input terminals N21 to N23 have the same waveforms as in the timing chart shown in FIG. 8. Further, the circuit, in the stage subsequent to the input terminals N21 to N23 of the level shifter circuit 900', which operates in accordance with the signals supplied to the input terminals N21 to N23, has the same circuit configuration as the level shifter circuit 3' (refer to FIG. 7). Therefore, it is self-evident from the timing charts shown in FIGS. 4 and 8 that a voltage signal having the waveform shown in the chart O101 OUTPUT SIGNAL is obtained at the output terminal O101 of the level shifter circuit 900' and a voltage signal having the waveform shown in the chart O102 OUTPUT SIGNAL is obtained at the output terminal O102 of the level shifter circuit 900'. This should be easy for a person skilled in the art to understand.

According to the above configuration, like the level shifter circuit 3' shown in FIG. 7, when making an integrated circuit, it is possible to reduce the circuit scale of the level shifter circuit 900' as compared to the level shifter circuit 683' (refer to FIG. 21). This makes it possible to reduce the chip area, thereby reducing production costs.

Moreover, when taking a close look at the level shifter circuit 443, the level shifter circuit 443 is arranged to (i) logically invert the pulse received at the input terminal N101 to generate a signal pf1 indicating that "H" and "L" of a voltage signal correspond to a voltage VD and a voltage VL, respectively and (ii) logically invert the pulse received at the input terminal N102 to generate a signal ps1 indicating that "H" and "L" of a voltage signal correspond to the voltage VD and the voltage VL, respectively. That is, in a case where the pulses to be supplied to the input terminals N101 and N102 are logically inverted by an inverter (not illustrated) etc. beforehand, it is possible to cause the level shifter circuit 443 to function as a level shifter circuit without the level shifter circuit 33. The scope of the present invention also encompasses the level shifter circuit 443 serving as a level shifter circuit in accordance with the present invention, which level shifter circuit 443 (i) receives, at its input terminals N101 and N102, the pulses logically inverted beforehand and (ii) generates and outputs the signals pf1 and ps1 in accordance with the pulses received at the respective input terminals N101 and N102.

FIG. 27 is a view illustrating a circuit configuration of a scanning line drive device including the level shifter circuit 900 or the level shifter circuit 900'.

A gate driver (scanning line drive device) 972 shown in FIG. 27 is different from the gate driver 672 shown in FIG. 18 in the following point.

The gate driver 972 includes g level shifter circuits 983 instead of n level shifter circuits 683. In the same manner as in the case of the level shifter circuits 683, the level shifter circuits 983 are additionally provided with respective reference numbers 1 to g.

Each of the level shifter circuits 9831 to 983g has two input terminals N101 and N102 and two output terminals (first and second output terminals) O101 and O102. Each of the level shifter circuits 9831 to 983g is constituted by the level shifter circuit 900 (refer to FIG. 23) or the level shifter circuit 900' (refer to FIG. 25).

The reference number 981 indicates a shift register circuit constituted by connecting n latch circuits 682. Each of the level shifter circuits 983 is connected with corresponding two output terminals of the shift register circuit 981. The timings of operations (how the gate driver 972 shifts pulses sequentially in synchronization with drive clock C) in FIG. 27 are illustrated in the timing chart shown in FIG. 19.

In the same manner as in the case of the shift register circuit 681 (refer to FIG. 18), the shift register circuit 981 operates in accordance with a start signal S and a drive clock C supplied thereto.

As illustrated in FIG. 19, the shift register circuit 981 operates as below. After a pulse is applied as the start signal S, output from the latch circuit 6821 in the first stage becomes "H" at the timing at which the drive clock C rises from "L" to "H". At the next timing at which the drive clock C rises from "L" to "H", the output from the latch circuit 6821 in the first stage becomes "L" and output from the latch circuit 6822 in the second stage becomes "H".

A "H" signal outputted from the latch circuit 6821 is supplied to the input terminal N101 of the level shifter circuit 9831. The signal received at the input terminal N101 is converted by the level shifter circuit 9831 into a voltage signal having a voltage level enough for liquid crystal drive. The voltage signal passes through a buffer circuit 6841, and then is outputted from the output terminal 6851 (refer to chart 6851 OUTPUT shown in FIG. 19). The voltage signal is outputted as a scanning line drive signal 676 (refer to FIG. 17) for driving one (1) scanning line 677 (refer to FIG. 17).

Further, a "H" signal outputted from the latch circuit 6822 is supplied to the input terminal N102 of the level shifter circuit 9831. The signal received at the input terminal N101 is converted by the level shifter circuit 9831 into a voltage signal having a voltage level enough for liquid crystal drive. The voltage signal passes through a buffer circuit 6842, and then is outputted from the output terminal 6852 (refer to chart 6852 OUTPUT shown in FIG. 19). The voltage signal is outputted as a scanning line drive signal 676 (refer to FIG. 17) for driving one (1) scanning line 677 (refer to FIG. 17).

According to the shift register circuit 981, the latch circuits 6823 to 682n in the third to nth stages sequentially output pulses at the timings of rising edges of the drive clock C. The pulses thus outputted sequentially are also converted into voltage signals by the respective level shifter circuits 9832 to 983g. Thereafter, the voltage signals pass through respective buffer circuits 6843 to 684n, and then are outputted from respective output terminals 6853 to 685n. The timings at which the voltage signals are outputted from the respective output terminals 6851 to 685n are as shown in FIG. 19. According to the timing chart shown in FIG. 19, the voltage signals are outputted sequentially from the respective output terminals 6851 to 685n at the timings of rising edges of the drive clock C in such a manner that a voltage signal is outputted from the output terminal 6851, a voltage signal is outputted from the output terminal 6852, . . . , and then a voltage signal is outputted from the output terminal 685n.

According to the gate driver 972 configured such that the level shifter circuit 900 or 900' in accordance with the present invention is applied to the gate driver 672 (shown in FIG. 18) which was described earlier as a premise of the present invention, it is possible to further reduce the circuit scale and thus to further reduce production costs.

The level shifter circuit in accordance with the present invention is configured such that: each of the first to sixth transistors is a p-channel MOS transistor; and each of the seventh to ninth transistors is an n-channel MOS transistor.

According to the configuration, the level shifter circuit has three n-channel MOS transistors for driving two scanning lines. This makes it possible to reduce the number of n-channel MOS transistors, thereby reducing the circuit scale and production costs of the level shifter circuit. Further, the level shifter circuit can be configured such that a pulse supplied to the gate terminal of the ninth transistor is a pulse representing a logical NAND of a pulse supplied to the gate terminal of the seventh transistor and a pulse supplied to the gate terminal of the eighth transistor. According to the configuration, it is possible to generate pulses that are to be supplied to the respective gate terminals of the seventh to ninth transistors and that selectively cause two of the seventh to ninth transistors to be conductive.

The level shifter circuit in accordance with the present invention is configured such that: each of the first to sixth transistors is an n-channel MOS transistor; and each of the seventh to ninth transistors is a p-channel MOS transistor.

According to the configuration, the level shifter circuit has six n-channel MOS transistors for driving two scanning lines. Note, however, that the drain terminals of the first, third and fifth transistors are connected with the respective source terminals of the second, fourth and sixth transistors. This makes the on-resistance of each of the first to six transistors in this configuration one half the on-resistance of each of the n-channel MOS transistors serving as the seventh to ninth transistors. Therefore, it is possible to achieve half-length gate terminals. Accordingly, it is possible to make the circuit scale of the level shifter circuit substantially equivalent to that having three re-channel MOS transistors serving as switches for driving two scanning lines, and thus possible to achieve the same effect as in the case of reducing the number of n-channel MOS transistors. This makes it possible to reduce the circuit scale and production costs of the level shifter circuit. Further, the level shifter circuit can be configured such that a pulse supplied to the gate terminal of the ninth transistor is a pulse representing a logical NOR of a pulse supplied to the gate terminal of the seventh transistor and a pulse supplied to the gate terminal of the eighth transistor. According to the configuration, it is possible to generate pulses that are to be supplied to the respective gate terminals of the seventh to ninth transistors and that selectively cause two of the seventh to ninth transistors to be conductive.

The level shifter circuit in accordance with the present invention is configured such that the pulses supplied to the respective gate terminals of the seventh to ninth transistors have been logically inverted beforehand.

According to the configuration, it is possible to prevent the voltage signals to be outputted from the level shifter circuit from being logically inverted relative to the pulses received at the level shifter circuit.

Further, a scanning line drive device in accordance with the present invention includes any of the foregoing level shifter circuits in accordance with the present invention.

According to the configuration, it is possible to cause the scanning line drive device to achieve the same functions and effects as those of the level shifter circuit in accordance with the present invention.

Note that a display device including any of the foregoing scanning line drive devices brings about the same effects as those of the scanning line drive device.

The invention is not limited to the description of the embodiments above, but may be altered within the scope of the claims. An embodiment based on a proper combination of technical means disclosed in different embodiments is encompassed in the technical scope of the invention.

INDUSTRIAL APPLICABILITY

The present invention is suitable for a level shifter circuit that converts a pulse into a binary voltage signal having predetermined voltage levels. Further, the present invention is suitable for (i) a scanning line drive device including: a shift register circuit which outputs a pulse according to which a plurality of scanning lines are sequentially driven; and a level shifter circuit which converts the pulse into a voltage signal having a voltage level suitable for carrying out a display on a display device and (ii) a display device including the scanning line drive device. The present invention is particularly suitable for a scanning line drive device and a display device each of which is for use in an active matrix liquid crystal display device.

REFERENCE SIGNS LIST 1, 210, and 981 Shift register circuit
2, 21 to 2g, and 9 Latch circuit (Pulse generation circuit)
3, 3', 33, 123, 443, 900, 900', 983, and 9831 to 983g Level shifter circuit
61 to 6g, 261 to 26g, and 461 to 46g Pulse (First pulse)
71 to 7g, 271 to 27g, and 471 to 47g Pulse (Second pulse)
8, 28, and 48 Selection circuit (Pulse generation circuit)
100, 200, 300, 400, and 972 Gate driver (Scanning line drive device)
301 to 309, and 321 to 329 Transistor (First to ninth transistors)
313 Power supply line (First power supply line)
319 Power supply line (Second power supply line)
676 Scanning line drive signal
677 Scanning line
N1 to N3, and N21 to N23 Input terminal (First to third input terminals)
O1 and O2, O21 and O22, and O101 and O102 Output terminal (First and second output terminals)
CS Operating clock
CS2 Frequency-divided clock
Q1 to Qg Pulse (Reference pulse)
QB1 to QBg Inverted pulse (Reference pulse)
QS1 to QSg Signal (Reference pulse)

The invention claimed is:
1. A scanning line drive device for supplying signals for driving a plurality of scanning lines, comprising:
a shift register circuit adapted to operate in accordance with a frequency-divided clock obtained by dividing the frequency of an operating clock by two supplied to the scanning line drive device;
a pulse generation circuit for generating, in accordance with an output signal received from the shift register circuit, (i) a reference pulse indicative of a period during which two successive scanning lines are not to be driven and a period during which the two successive scanning lines are to be driven, (ii) a first pulse indicative of a first period during which one of the two successive scanning lines is to be driven, which first period is part of the period during which the two successive scanning lines are to be driven, and (iii) a second pulse indicative of a second period during which the other one of the two successive scanning lines is to be driven, which second period is part of the period during which the two successive scanning lines are to be driven; and a level shifter circuit having first to third input terminals, first and second output terminals, first and second power supplies which apply voltages of respective different levels, and first to ninth transistors,
wherein, in the level shifter circuit,
a gate terminal of the first transistor is connected with a gate terminal of the third transistor, a drain terminal of the first transistor is connected with a source terminal of the second transistor, and a source terminal of the first transistor is connected with the first power supply,
a gate terminal of the second transistor is connected with a drain terminal of the fourth transistor, a drain terminal of the second transistor is connected with a drain terminal of the seventh transistor,
the gate terminal of the third transistor is connected with a drain terminal of the sixth transistor, a drain terminal of the third transistor is connected with a source terminal of the fourth transistor, and a source terminal of the third transistor is connected with the first power supply,
a gate terminal of the fourth transistor is connected with the drain terminal of the second transistor, the drain terminal of the fourth transistor is connected with a drain terminal of the eighth transistor,
a gate terminal of the fifth transistor is connected with the drain terminal of the fourth transistor, a drain terminal of the fifth transistor is connected with a source terminal of the sixth transistor, and a source terminal of the fifth transistor is connected with the first power supply,
a gate terminal of the sixth transistor is connected with the gate terminal of the fourth transistor, the drain terminal of the sixth transistor is connected with a drain terminal of the ninth transistor,
a gate terminal of the seventh transistor is connected with the first input terminal, and a source terminal of the seventh transistor is connected with the second power supply,
a gate terminal of the eighth transistor is connected with the second input terminal, and a source terminal of the eighth transistor is connected with the second power supply,
a gate terminal of the ninth transistor is connected with the third input terminal, and a source terminal of the ninth transistor is connected with the second power supply, and
the first output terminal is connected with the drain terminal of the seventh transistor, and the second output terminal is connected with the drain terminal of the eighth transistor,
wherein the first pulse is supplied to the first input terminal, the second pulse is supplied to the second input terminal, and the reference pulse is supplied to the third input terminal, and
wherein, by the first pulse, the second pulse and the reference pulse,
during the period during which the two successive scanning lines are not to be driven, the ninth transistor is caused to be nonconductive and the seventh and eighth transistors are caused to be conductive, whereby a voltage signal having a voltage level corresponding to a voltage that the second power supply applies is outputted from each of the first and second output terminals,
during the first period, the seventh transistor is caused to be nonconductive and the eighth and ninth transistors are caused to be conductive, whereby a voltage signal having a voltage level corresponding to a voltage that the first power supply applies is outputted from the first output terminal and a voltage signal having a voltage level corresponding to a voltage that the second power supply applies is outputted from the second output terminal, and during the second period, the eighth transistor is caused to be nonconductive and the seventh and ninth transistors are caused to be conductive, whereby a voltage signal having a voltage level corresponding to a voltage that the second power supply applies is outputted from the first output terminal and a voltage signal having a voltage level corresponding to a voltage that the first power supply applies is outputted from the second output terminal.

2. A level shifter circuit, comprising:
first to third input terminals;
first and second output terminals;
first and second power supplies which apply voltages of respective different levels; and
first to ninth transistors,
wherein
a gate terminal of the first transistor is connected with a gate terminal of the third transistor, a drain terminal of the first transistor is connected with a source terminal of the second transistor, and a source terminal of the first transistor is connected with the first power supply,
a gate terminal of the second transistor is connected with a drain terminal of the fourth transistor, a drain terminal of the second transistor is connected with a drain terminal of the seventh transistor,
the gate terminal of the third transistor is connected with a drain terminal of the sixth transistor, a drain terminal of the third transistor is connected with a source terminal of the fourth transistor, and a source terminal of the third transistor is connected with the first power supply,
a gate terminal of the fourth transistor is connected with the drain terminal of the second transistor, the drain terminal of the fourth transistor is connected with a drain terminal of the eighth transistor,
a gate terminal of the fifth transistor is connected with the drain terminal of the fourth transistor, a drain terminal of the fifth transistor is connected with a source terminal of the sixth transistor, and a source terminal of the fifth transistor is connected with the first power supply,
a gate terminal of the sixth transistor is connected with the gate terminal of the fourth transistor, the drain terminal of the sixth transistor is connected with a drain terminal of the ninth transistor,
a gate terminal of the seventh transistor is connected with the first input terminal, and a source terminal of the seventh transistor is connected with the second power supply,
a gate terminal of the eighth transistor is connected with the second input terminal, and a source terminal of the eighth transistor is connected with the second power supply, and
a gate terminal of the ninth transistor is connected with the third input terminal, and a source terminal of the ninth transistor is connected with the second power supply, wherein the first output terminal is connected with the drain terminal of the seventh transistor, and the second output terminal is connected with the drain terminal of the eighth transistor, wherein pulses that selectively cause two of the seventh to ninth transistors to be conductive are supplied to the respective gate terminals of the respective seventh to ninth transistors, wherein, while the ninth transistor is nonconductive and the seventh and eighth transistors are conductive, a voltage signal having a voltage level corresponding to a voltage that the second power supply applies is outputted from each of the first and second output terminals, wherein, while the seventh transistor is nonconductive and the eighth and ninth transistors are conductive, a voltage signal having a voltage level corresponding to a voltage that the first power supply applies is outputted from the first output terminal, and a voltage signal having a voltage level corresponding to a voltage that the second power supply applies is outputted from the second output terminal, and wherein, while the eighth transistor is nonconductive and the seventh and ninth transistors are conductive, a voltage signal having a voltage level corresponding to a voltage that the second power supply applies is outputted from the first output terminal, and a voltage signal having a voltage level corresponding to a voltage that the first power supply applies is outputted from the second output terminal.

3. The level shifter circuit according to claim 2, wherein:
each of the first to sixth transistors is a p-channel MOS transistor; and
each of the seventh to ninth transistors is an n-channel MOS transistor.

4. The level shifter circuit according to claim 3, wherein a pulse supplied to the gate terminal of the ninth transistor is a pulse representing a logical NAND of a pulse supplied to the gate terminal of the seventh transistor and a pulse supplied to the gate terminal of the eighth transistor.

5. The level shifter circuit according to claim 2, wherein:
each of the first to sixth transistors is an n-channel MOS transistor; and
each of the seventh to ninth transistors is a p-channel MOS transistor.

6. The level shifter circuit according to claim 5, wherein a pulse supplied to the gate terminal of the ninth transistor is a pulse representing a logical NOR of a pulse supplied to the gate terminal of the seventh transistor and a pulse supplied to the gate terminal of the eighth transistor.

7. The level shifter circuit according to claim 2, wherein the pulses supplied to the respective gate terminals of the seventh to ninth transistors have been logically inverted beforehand.

8. A scanning drive line device comprising a level shifter circuit comprising:
first to third input terminals;
first and second output terminals;
first and second power supplies which apply voltages of respective different levels; and
first to ninth transistors,
wherein
a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, a gate terminal of the seventh transistor is connected with the first input terminal, and a source terminal of the seventh transistor is connected with the second power supply, a gate terminal of the eighth transistor is connected with the second input terminal, and a source terminal of the eighth transistor is connected with the second power supply, and a gate terminal of the ninth transistor is connected with the third input terminal, and a source terminal of the ninth transistor is connected with the second power supply, wherein the first output terminal is connected with the drain terminal of the seventh transistor, and the second output terminal is connected with the drain terminal of the eighth transistor, wherein pulses that selectively cause two of the seventh to ninth transistors to be conductive are supplied to the respective gate terminals of the respective seventh to ninth transistors, wherein, while the ninth transistor is nonconductive and the seventh and eighth transistors are conductive, a voltage signal having a voltage level corresponding to a voltage that the second power supply applies is outputted from each of the first and second output terminals, wherein, while the seventh transistor is nonconductive and the eighth and ninth transistors are conductive, a voltage signal having a voltage level corresponding to a voltage that the first power supply applies is outputted from the first output terminal, and a voltage signal having a voltage level corresponding to a voltage that the second power supply applies is outputted from the second output terminal, and wherein, while the eighth transistor is nonconductive and the seventh and ninth transistors are conductive, a voltage signal having a voltage level corresponding to a voltage that the second power supply applies is outputted from the first output terminal, and a voltage signal having a voltage level corresponding to a voltage that the first power supply applies is outputted from the second output terminal.

9. A display device comprising a scanning line drive device for supplying signals for driving a plurality of scanning lines, comprising:

a shift register circuit adapted to operate in accordance with a frequency-divided clock obtained by dividing the frequency of an operating clock by two supplied to the scanning line drive device;

a pulse generation circuit for generating, in accordance with an output signal received from the shift register circuit, (i) a reference pulse indicative of a period during which two successive scanning lines are not to be driven and a period during which the two successive scanning lines are to be driven, (ii) a first pulse indicative of a first period during which one of the two successive scanning lines is to be driven, which first period is part of the period during which the two successive scanning lines are to be driven, and (iii) a second pulse indicative of a second period during which the other one of the two successive scanning lines is to be driven, which second period is part of the period during which the two successive scanning lines are to be driven; and a level shifter circuit having first to third input terminals, first and second output terminals, first and second power supplies which apply voltages of respective different levels, and first to ninth transistors, wherein, in the level shifter circuit, a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, and the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, a gate terminal of the seventh transistor is connected with the first input terminal, and a source terminal of the seventh transistor is connected with the second power supply, a gate terminal of the eighth transistor is connected with the second input terminal, and a source terminal of the eighth transistor is connected with the second power supply, a gate terminal of the ninth transistor is connected with the third input terminal, and a source terminal of the ninth transistor is connected with the second power supply, and the first output terminal is connected with the drain terminal of the seventh transistor, and the second output terminal is connected with the drain terminal of the eighth transistor, wherein the first pulse is supplied to the first input terminal, the second pulse is supplied to the second input terminal, and the reference pulse is supplied to the third input terminal, and wherein, by the first pulse, the second pulse and the reference pulse, during the period during which the two successive scanning lines are not to be driven, the ninth transistor is caused to be nonconductive and the seventh and eighth transistors are caused to be conductive, whereby a voltage signal having a voltage level corresponding to a voltage that the second power supply applies is outputted from each of the first and second output terminals, during the first period, the seventh transistor is caused to be nonconductive and the eighth and ninth transistors are caused to be conductive, whereby a voltage signal having a voltage level corresponding to a voltage that the first power supply applies is outputted from the first output terminal and a voltage signal having a voltage level corresponding to a voltage that the second power supply applies is outputted from the second output terminal, and during the second period, the eighth transistor is caused to be nonconductive and the seventh and ninth transistors are caused to be conductive, whereby a voltage signal having a voltage level corresponding to a voltage that the second power supply applies is outputted from the first output terminal and a voltage signal having a voltage level corresponding to a voltage that the first power supply applies is outputted from the second output terminal.

10. A display device comprising a scanning line drive device comprising a level shifter circuit comprising:

first to third input terminals;

first and second output terminals;

first and second power supplies which apply voltages of respective different levels; and first to ninth transistors, wherein a gate terminal of the first transistor is connected with a gate terminal of the third transistor, a drain terminal of the first transistor is connected with a source terminal of the second transistor, and a source terminal of the first transistor is connected with the first power supply, a gate terminal of the second transistor is connected with a drain terminal of the fourth transistor, a drain terminal of the second transistor is connected with a drain terminal of the seventh transistor, the gate terminal of the third transistor is connected with a drain terminal of the sixth transistor, a drain terminal of the third transistor is connected with a source terminal of the fourth transistor, and a source terminal of the third transistor is connected with the first power supply, a gate terminal of the fourth transistor is connected with the drain terminal of the second transistor, the drain terminal of the fourth transistor is connected with a drain terminal of the eighth transistor, a gate terminal of the fifth transistor is connected with the drain terminal of the fourth transistor, a drain terminal of the fifth transistor is connected with a source terminal of the sixth transistor, and a source terminal of the fifth transistor is connected with the first power supply, a gate terminal of the sixth transistor is connected with the gate terminal of the fourth transistor, the drain terminal of the sixth transistor is connected with a drain terminal of the ninth transistor, a gate terminal of the seventh transistor is connected with the first input terminal, and a source terminal of the seventh transistor is connected with the second power supply, a gate terminal of the eighth transistor is connected with the second input terminal, and a source terminal of the eighth transistor is connected with the second power supply, and a gate terminal of the ninth transistor is connected with the third input terminal, and a source terminal of the ninth transistor is connected with the second power supply, wherein the first output terminal is connected with the drain terminal of the seventh transistor, and the second output terminal is connected with the drain terminal of the eighth transistor, wherein pulses that selectively cause two of the seventh to ninth transistors to be conductive are supplied to the respective gate terminals of the respective seventh to ninth transistors, wherein, while the ninth transistor is nonconductive and the seventh and eighth transistors are conductive, a voltage signal having a voltage level corresponding to a voltage that the second power supply applies is outputted from each of the first and second output terminals, wherein, while the seventh transistor is nonconductive and the eighth and ninth transistors are conductive, a voltage signal having a voltage level corresponding to a voltage that the first power supply applies is outputted from the first output terminal, and a voltage signal having a voltage level corresponding to a voltage that the second power supply applies is outputted from the second output terminal, and wherein, while the eighth transistor is nonconductive and the seventh and ninth transistors are conductive, a voltage signal having a voltage level corresponding to a voltage that the second power supply applies is outputted from the first output terminal, and a voltage signal having a voltage level corresponding to a voltage that the first power supply applies is outputted from the second output terminal.

* * * * *